(12) United States Patent
Jin et al.

(10) Patent No.: US 11,088,706 B2
(45) Date of Patent: Aug. 10, 2021

(54) INFORMATION PROCESSING METHOD, APPARATUS, AND COMMUNICATIONS DEVICE

(71) Applicant: HUAWEI TECHNOLOGIES CO., LTD., Guangdong (CN)

(72) Inventors: Jie Jin, Moscow (RU); Ivan Leonidovich Mazurenko, Moscow (RU); Aleksandr Aleksandrovich Petiushko, Moscow (RU); Chaolong Zhang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 51 days.

(21) Appl. No.: 16/719,529

(22) Filed: Dec. 18, 2019

(65) Prior Publication Data

US 2020/0127682 A1   Apr. 23, 2020

Related U.S. Application Data

(63) Continuation of application No. PCT/CN2018/092974, filed on Jun. 27, 2018.

(30) Foreign Application Priority Data

Jun. 27, 2017 (CN) .......................... 201710502721.6

(51) Int. Cl.
  *H03M 13/00* (2006.01)
  *H03M 13/11* (2006.01)
(52) U.S. Cl.
  CPC ..... *H03M 13/1105* (2013.01); *H03M 13/616* (2013.01)
(58) Field of Classification Search
  CPC .................. H03M 13/1105; H03M 13/616
  See application file for complete search history.

(56) References Cited

U.S. PATENT DOCUMENTS

| 7,752,521 B2 | 7/2010 | Livshitz |
| 2011/0066916 A1 | 3/2011 | Abu-Surra et al. |
| 2016/0164537 A1* | 6/2016 | Pisek ................. H03M 13/1154 714/755 |

FOREIGN PATENT DOCUMENTS

| CN | 101141133 A | 3/2008 |
| CN | 101162907 A | 4/2008 |

(Continued)

OTHER PUBLICATIONS

Li et al. Algebra-Assisted Construction of Quasi-Cyclic LDPC Codes for 5G New Radio. Jul. 31, 2018. IEEE Access. vol. 6, 2018. pp. 50229 to50244.*

(Continued)

*Primary Examiner* — Samir W Rizk
(74) *Attorney, Agent, or Firm* — Womble Bond Dickinson (US) LLP

(57) ABSTRACT

This application discloses an encoding method, an apparatus, a communications device, and a communications system. The method includes: encoding an input bit sequence by using a low density parity check LDPC matrix, where the LDPC matrix is obtained based on a lifting factor Z and a base matrix, and the base matrix includes a row 0 to a row 4 and a column 0 to a column 26 in one of matrices shown in FIG. 3b-1A to FIG. 3b-8B, or the base matrix includes a row 0 to a row 4 and some of a column 0 to a column 26 in one of matrices shown in FIG. 3b-1A to FIG. 3b-8B. According to the encoding method, the apparatus, the communications device, and the communications system, channel coding requirements can be met.

18 Claims, 23 Drawing Sheets

(56) References Cited

FOREIGN PATENT DOCUMENTS

| CN | 101834613 A | 9/2010 |
|---|---|---|
| CN | 104333390 A | 2/2015 |
| CN | 106685586 A | 5/2017 |
| CN | 106849958 A | 6/2017 |
| WO | 2006039801 A1 | 4/2006 |

OTHER PUBLICATIONS

3GPP TSG-RAN WG1 Meeting NR#2 R1-1710829,:"On NR LDPC design and performance",Mediatek Inc. , Qingdao, CN, Jun. 27-30, 2017,total 6 pages.
3GPP TSG-RAN WG1 #89ah, R1-1711213:"LDPC Rate Compatible Design",Qualcomm Incorporated,Jun. 27-30, 2017,total 11 pages.
3GPP TSG RAN WG1 Meeting #89,R1-1706970:"LDPC design for eMBB data",Huawei, HiSilicon,Huawei, HiSilicon, total 11 pages.
Wang Geng, Research and Implementation of QC-LDPC Code for Shortwave Communication. Xidian University, 2011, Issue 12, 1 page.
R. G. Gallager; Low Density Parity Check Codes; IRE Transactions on Information Theory; Jan. 2016, 1962; pp. 21-28; total 8 pages.
ZTE, ZTE Microelectronics, Compact LDPC design for eMBB. 3GPP TSG RAN WG1 AH NR Meeting Spokane, USA Jan. 16-20, 2017, R1-1701473, 19 pages.
Ming Jiang et al, An improved variable length coding scheme using structured LDPC codes. 2010 International Conference on Wireless Communications and Signal Processing (WCSP), Nov. 11, 2010, 5 pages.

* cited by examiner

CONT. FROM FIG. 3a-1

FIG. 3b-1A

CONT. FROM FIG. 3b-1A

CONT. FROM FIG. 3b-2A

CONT. FROM FIG. 3b-5A

INFORMATION PROCESSING METHOD, APPARATUS, AND COMMUNICATIONS DEVICE

CROSS-REFERENCE TO RELATED APPLICATIONS

This application is a continuation of International Application No. PCT/CN2018/092974, filed on Jun. 27, 2018, which claims priority to Chinese Patent Application No. 201710502721.6, filed on Jun. 27, 2017. The disclosures of the aforementioned applications are hereby incorporated by reference in their entireties.

TECHNICAL FIELD

Embodiments of the present application relate to the communications field, and in particular, to an information processing method and a communications apparatus.

BACKGROUND

A low density parity check (LDPC) code is a type of linear block coding with a sparse check matrix, and is characterized by a flexible structure and low decoding complexity. Because the LDPC code uses partially parallel iterative decoding algorithms, the LDPC code has a higher throughput than a conventional Turbo code. The LDPC code may be used as an error-correcting code in a communications system, to improve channel transmission reliability and power utilization. The LDPC codes may further be widely applied to a space communication system, an optical fiber communication system, a personal communications system, ADSL, a magnetic recording device, and the like. Currently, the LDPC code has been considered as one of channel coding schemes in the 5th generation mobile communications.

In an actual using process, an LDPC matrix having a special structure may be used. The LDPC matrix H having the special structure may be obtained by lifting an LDPC base matrix having a quasi cycle (QC) structure. A QC-LDPC is suitable for hardware with high parallelism, and provides a higher throughput. The LDPC matrix can be applied to channel coding by designing the LDPC matrix.

A QC-LDPC is suitable for hardware with high parallelism, and provides a higher throughput. The LDPC matrix can be applied to channel coding by designing the LDPC matrix.

SUMMARY

Embodiments of the present application provide an information processing method, a communications apparatus, and a communications system, to support encoding and decoding of information bit sequences of a plurality of lengths.

According to a first aspect, an encoding method and an encoder are provided. The encoder encodes an input sequence by using a low density parity check (LDPC) matrix.

According to a second aspect, a decoding method and a decoder are provided. The decoder decodes an input sequence by using a LDPC matrix.

In one embodiment of the first aspect or the second aspect, the LDPC matrix is obtained based on a lifting factor Z and a base matrix.

Based on the foregoing embodiment, a base matrix of a base graph 30a may include a row 0 to a row 4 and a column 0 to a column 26 in one of matrices 30b-10, 30b-20, 30b-30, 30b-40, 30b-50, 30b-60, 30b-70, and 30b-80; or the base matrix includes a row 0 to a row 4 and some of a column 0 to a column 26 in one of matrices 30b-10, 30b-20, 30b-30, 30b-40, 30b-50, 30b-60, 30b-70, and 30b-80; or the base matrix may be a matrix obtained by performing a row/column transform on a row 0 to a row 4 and a column 0 to a column 26 in one of matrices 30b-10 to 30b-80; or the base matrix may be a matrix obtained by performing a row/column transform on a row 0 to a row 4 and some of a column 0 to a column 26 in one of matrices 30b-10, 30b-20, 30b-30, 30b-40, 30b-50, 30b-60, 30b-70, and 30b-80.

Further, the base matrix of the base graph 30a may further include the row 0 to a row (m−1) and the column 0 to a column (n−1) in one of the matrices 30b-10, 30b-20, 30b-30, 30b-40, 30b-50, 30b-60, 30b-70, and 30b-80; or the base matrix may be a matrix obtained by performing a row/column transform on the row 0 to a row (m−1) and the column 0 to a column (n−1) in one of the matrices 30b-10, 30b-20, 30b-30, 30b-40, 30b-50, 30b-60, 30b-70, and 30b-80, where 5≤m≤46 and 27≤n≤68.

To support different block lengths, different lifting factors Z are required for an LDPC code. Based on the foregoing embodiment, base matrices corresponding to the different lifting factors Z are used based on the different lifting factors Z. For example, $Z=a\times 2^j$, $0\leq j<7$, and $a\in\{2, 3, 5, 7, 9, 11, 13, 15\}$.

If a=2, the base matrix may include a row 0 to a row 4 and a column 0 to a column 26 in the matrix 30b-10, or the base matrix includes a row 0 to a row 4 and some of a column 0 to a column 26 in the matrix 30b-10. Further, the base matrix further includes the row 0 to a row (m−1) and the column 0 to a column (n−1) in the matrix 30b-10.

If a=3, the base matrix may include a row 0 to a row 4 and a column 0 to a column 26 in the matrix 30b-20, or the base matrix includes a row 0 to a row 4 and some of a column 0 to a column 26 in the matrix 30b-20 1. Further, the base matrix further includes the row 0 to a row (m−1) and the column 0 to a column (n−1) in the matrix 30b-20.

If a=5, the base matrix may include a row 0 to a row 4 and a column 0 to a column 26 in the matrix 30b-30, or the base matrix includes a row 0 to a row 4 and some of a column 0 to a column 26 in the matrix 30b-30. Further, the base matrix further includes the row 0 to a row (m−1) and the column 0 to a column (n−1) in the matrix 30b-30.

If a=7, the base matrix may include a row 0 to a row 4 and a column 0 to a column 26 in the matrix 30b-40, or the base matrix includes a row 0 to a row 4 and some of a column 0 to a column 26 in the matrix 30b-40. Further, the base matrix further includes the row 0 to a row (m−1) and the column 0 to a column (n−1) in the matrix 30b-40.

If a=9, the base matrix may include a row 0 to a row 4 and a column 0 to a column 26 in the matrix 30b-50, or the base matrix includes a row 0 to a row 4 and some of a column 0 to a column 26 in the matrix 30b-50. Further, the base matrix further includes the row 0 to a row (m−1) and the column 0 to a column (n−1) in the matrix 30b-50.

If a=11, the base matrix may include a row 0 to a row 4 and a column 0 to a column 26 in the matrix 30b-60, or the base matrix includes a row 0 to a row 4 and some of a column 0 to a column 26 in the matrix 30b-60. Further, the base matrix further includes the row 0 to a row (m−1) and the column 0 to a column (n−1) in the matrix 30b-60.

If a=13, the base matrix may include a row 0 to a row 4 and a column 0 to a column 26 in the matrix 30b-70, or the base matrix includes a row 0 to a row 4 and some of a column 0 to a column 26 in the matrix 30b-70. Further, the base matrix further includes the row 0 to a row (m−1) and the column 0 to a column (n−1) in the matrix 30b-70.

If a=15, the base matrix may include a row 0 to a row 4 and a column 0 to a column 26 in the matrix 30b-80, or the base matrix includes a row 0 to a row 4 and some of a column 0 to a column 26 in the matrix 30b-80. Further, the base matrix further includes the row 0 to a row (m−1) and the column 0 to a column (n−1) in the matrix 30b-80.

The base matrix may be a matrix obtained by performing a row/column transform on a corresponding matrix.

Further, in one embodiment, the LDPC matrix may be obtained based on the lifting factor Z and a matrix Hs that is obtained by compensating each of the foregoing base matrices, or may be obtained based on the lifting factor Z and a matrix that is obtained by performing a row/column transform on a matrix Hs obtained by compensating each of the foregoing base matrices. The compensating each of the foregoing base matrices may be increasing or decreasing, by an offset, a shift value that is greater than or equal to 0 and that corresponds to an element in one or more columns of the matrix.

The base graph and the base matrix of the LDPC matrix in the foregoing embodiment can meet performance requirements for code blocks of a plurality of block lengths.

Based on any one of the foregoing aspects or the possible embodiments of the aspects, in another possible embodiment, the encoding method further includes: determining the lifting factor Z. For example, a value of the lifting factor Z is determined based on a length K of the input sequence. In a supported lifting factor set, a minimum $Z_0$ may be found and used as the value of the lifting factor Z, and $Kb \cdot Z_0 \geq K$ is met. In one embodiment, Kb may be a quantity of information bit columns in the base matrix of the LDPC code. For example, in the base graph 30a, Kb=22. In another embodiment, a value of Kb may alternatively vary with a value of K, but does not exceed a quantity of information bit columns in the base matrix of the LDPC code. For example, when K is greater than a first threshold, Kb=22; or when K is less than or equal to a first threshold, and Kb=21. Alternatively, when K is greater than a first threshold, Kb=22; when K is less than or equal to a first threshold, and K is greater than a second threshold, Kb=21; or when K is less than or equal to a second threshold, Kb=20.

The lifting factor Z may be determined by the encoder or the decoder based on the length K of the input sequence, or may be determined by another device and then provided as an input parameter to the encoder or the decoder.

In one embodiment, the LDPC matrix may be obtained based on the obtained lifting factor Z and a base matrix corresponding to the lifting factor Z.

In one embodiment of the first aspect or the second aspect, the LDPC matrix is obtained based on the lifting factor Z and parameters of the LDPC base matrix.

The parameters of the LDPC matrix may include a row index, columns in which non-zero elements are located, and shift values of the non-zero elements, and are saved in forms of Table 3-10, Table 3-20, Table 3-30, Table 3-40, Table 3-50, Table 3-60, Table 3-70, and Table 3-80. A row weight may further be included. Each of position in the columns in which the non-zero elements are located is in a one-to-one correspondence with each of the shift values of the non-zero elements.

In this way, the encoder encodes the input sequence based on the lifting factor Z and the parameters of the LDPC matrix. Parameters saved in Table 3-10 correspond to the matrix 30b-10, parameters saved in Table 3-20 correspond to the matrix 30b-20, parameters saved in Table 3-30 correspond to the matrix 30b-30, parameters saved in Table 3-40 correspond to the matrix 30b-40, parameters saved in Table 3-50 correspond to the matrix 30b-50, parameters saved in Table 3-60 correspond to the matrix 30b-60, parameters saved in Table 3-70 correspond to the matrix 30b-70, and parameters saved in Table 3-80 correspond to the matrix 30b-80.

For a communications device at a transmit end, the encoding the input sequence by using the LDPC matrix may include:

encoding the input sequence by using the LDPC matrix corresponding to the lifting factor Z; or performing a row/column transform on the LDPC matrix corresponding to the lifting factor Z, and encoding the input sequence by using a row/column-transformed matrix. In this application, the row/column transform is a row transform, a column transform, or a row transform and a column transform.

For a communications device at a receive end, the decoding the input sequence by using the LDPC matrix may include:

decoding the input sequence by using the LDPC matrix corresponding to the lifting factor Z; or performing a row/column transform on the LDPC matrix corresponding to the lifting factor Z, and encoding the input sequence by using a row/column-transformed matrix. In this application, the row/column transform is a row transform, a column transform, or a row transform and a column transform.

In one embodiment, the LDPC matrix may be saved, and the input sequence is encoded by using the LDPC matrix; or an LDPC matrix that may be used for encoding is obtained through transformation (by performing a row/column transform) or lifting based on the LDPC matrix.

In one embodiment, the parameters may be saved, and an LDPC matrix used for encoding or decoding may be obtained based on the parameters, so that the input sequence can be encoded or decoded based on the LDPC matrix. The parameters include at least one of the following: a base graph, a base matrix, a transformed matrix obtained by performing a row/column transform based on the base graph or the base matrix, a lifting matrix based on the base graph or the base matrix, a shift value of a non-zero element in the base matrix, or any parameter related to LDPC matrix obtaining.

In one embodiment, the base matrix of the LDPC matrix may be saved in a memory.

In one embodiment, the base graph of the LDPC matrix is saved in a memory, and the shift value of the non-zero element in the base matrix of the LDPC matrix may be saved in the memory.

In one embodiment, the parameters of the LDPC matrix are saved in a memory in forms of Table 3-10 to Table 23-80.

Based on the foregoing embodiments, at least one of a base graph and a base matrix that are used for LDPC encoding or decoding is obtained by performing row switching, column switching, or row switching and column switching on at least one of the base graph and the base matrix of the LDPC matrix.

According to a third aspect, a communications apparatus is provided. The communications apparatus may include corresponding modules configured to perform the foregoing method designs. The modules may be software and/or hardware.

In one embodiment, the communications apparatus provided in the third aspect includes a processor and a transceiver component. The processor and the transceiver component may be configured to implement functions in the foregoing encoding or decoding method. In this design, if the communications apparatus is a terminal, a base station, or another network device, the transceiver component of the communications apparatus may be a transceiver. If the communications apparatus is a baseband chip or a baseband processing board, the transceiver component of the communications apparatus may be an input/output circuit of the baseband chip or the baseband processing board, and is configured to receive/send an input/output signal. In one embodiment, the communications apparatus may further include a memory, configured to store data and/or an instruction.

In one embodiment, the processor may include the encoder in the first aspect and a determining unit. The determining unit is configured to determine a lifting factor Z required for encoding an input sequence. The encoder is configured to encode the input sequence by using an LDPC matrix corresponding to the lifting factor Z.

In one embodiment, the processor may include the decoder in the second aspect and an obtaining unit. The obtaining unit is configured to obtain a soft value of an LDPC code and a lifting factor Z. The decoder is configured to decode the soft value of the LDPC code based on a base matrix $H_B$ corresponding to the lifting factor Z, to obtain an information bit sequence.

According to a fourth aspect, a communications apparatus is provided. The communications apparatus includes one or more processors.

In one embodiment, the one or more processors may implement functions of the encoder in the first aspect. In one embodiment, the encoder in the first aspect may be a part of the processor. The processor may implement other functions in addition to the functions of the encoder in the first aspect.

In one embodiment, the one or more processors may implement functions of the decoder in the second aspect. In one embodiment, the decoder in the second aspect may be a part of the processor.

In one embodiment, the communications apparatus may further include a transceiver and an antenna.

In one embodiment, the communications apparatus may further include a device configured to generate a transport block CRC, a device configured to perform code block segmentation and a CRC check, an interleaver configured to perform interleaving, a modulator configured to perform modulation processing, or the like.

In one embodiment, the communications apparatus may further include a demodulator configured to perform a demodulation operation, a deinterleaver configured to perform deinterleaving, a device configured to perform de-rate matching, or the like. Functions of these devices may be implemented by the one or more processors.

In one embodiment, functions of these devices may be implemented by the one or more processors.

According to a fifth aspect, an embodiment of this application provides a communications system. The system includes the communications apparatus in the third aspect.

According to a sixth aspect, an embodiment of the present application provides a communications system. The system includes one or more communications apparatuses in the fourth aspect.

According to still another aspect, an embodiment of the present application provides a computer storage medium. The computer storage medium stores a program, and when the program runs, a computer is enabled to perform the methods in the foregoing aspects.

Yet another aspect of this application provides a computer program product including an instruction. When the instruction is run on a computer, the computer is enabled to perform the methods in the foregoing aspects.

According to the information processing method, the apparatus, the communications device, and the communications system in the embodiments of the present application, a system requirement for flexible code lengths and code rates can be met in terms of encoding performance and an error floor.

BRIEF DESCRIPTION OF DRAWINGS

Figures 3A, 3B:
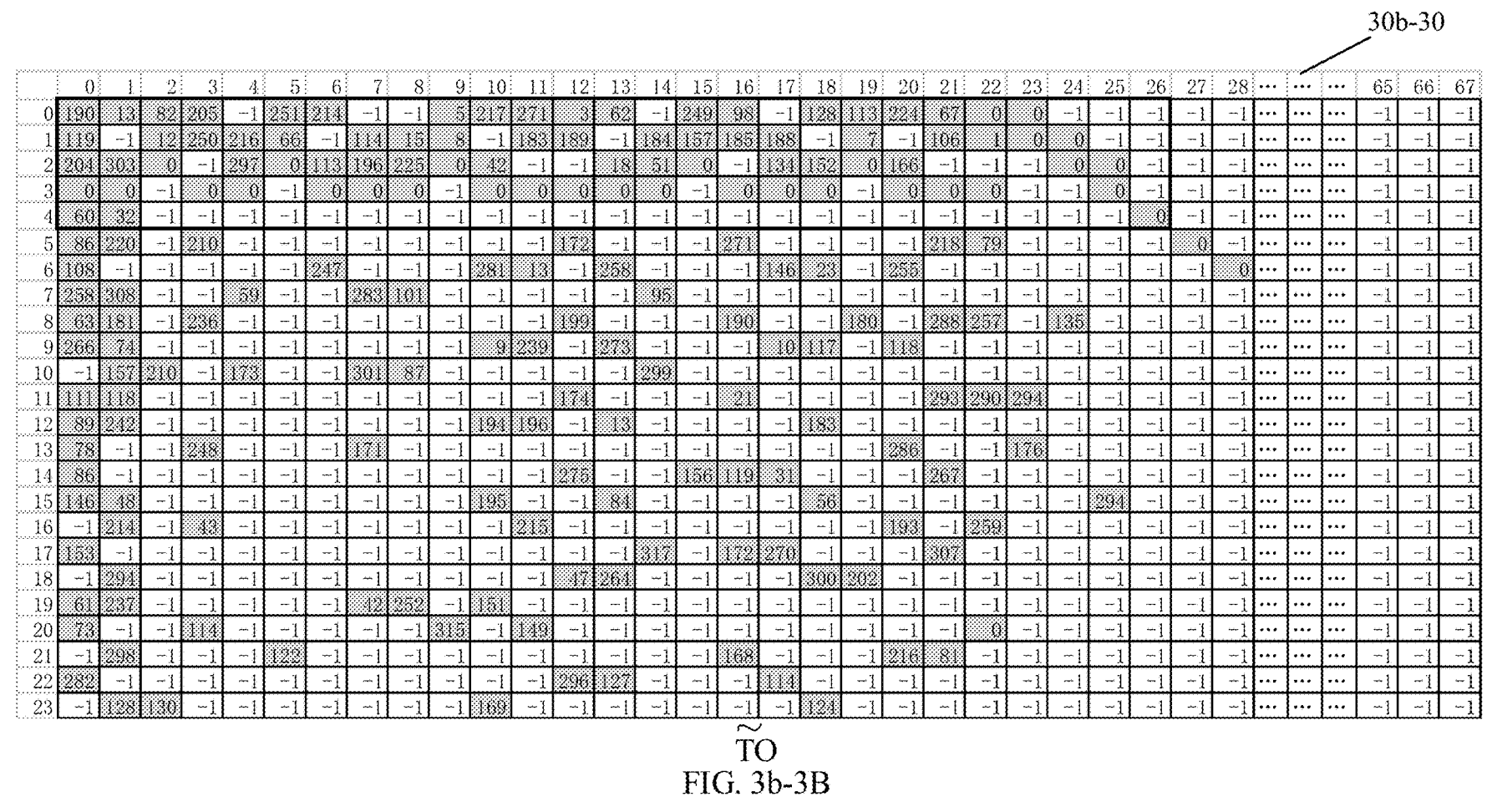
Figure 3B:
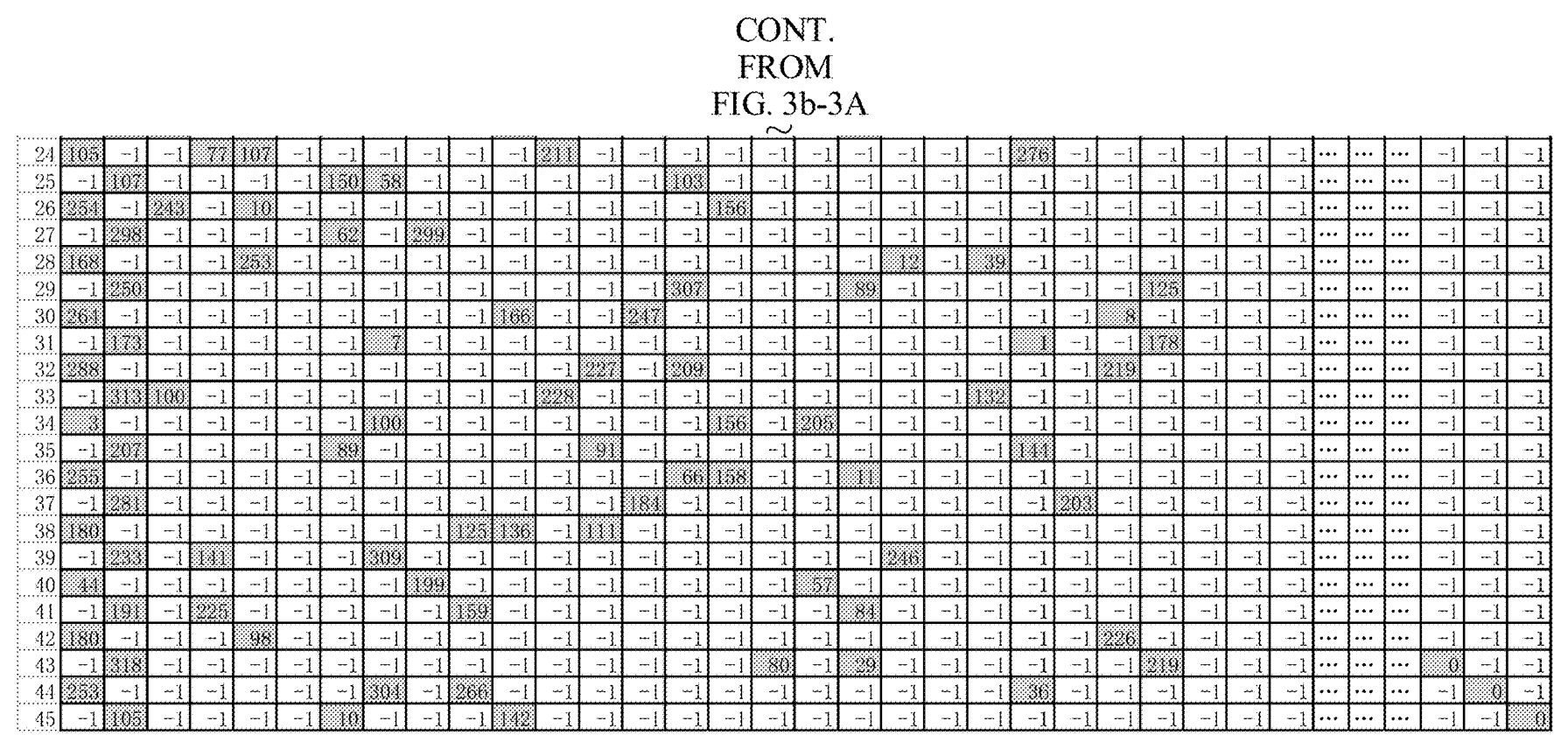

FIG. 3a-1 and FIG. 3a-2 are a schematic diagram of a base graph of an LDPC code according to an embodiment of the present application;

FIG. 3b-1A and FIG. 3b-1B are a schematic diagram of a base matrix according to an embodiment of the present application;

FIG. 3b-2A and FIG. 3b-2B are a schematic diagram of another base matrix according to an embodiment of the present application;

FIG. 3b-3A and FIG. 3b-6B are a schematic diagram of another base matrix according to an embodiment of the present application;

FIG. 3b-4A and FIG. 3b-4B are a schematic diagram of another base matrix according to an embodiment of the present application;

FIG. 3b-5A and FIG. 3b-5B are a schematic diagram of another base matrix according to an embodiment of the present application;

FIG. 3b-6A and FIG. 3b-6B are a schematic diagram of another base matrix according to an embodiment of the present application;

FIG. 3b-7A and FIG. 3b-7B are a schematic diagram of another base matrix according to an embodiment of the present application;

FIG. 3b-8A and FIG. 3b-8B are a schematic diagram of another base matrix according to an embodiment of the present application;

FIG. 4 is a schematic performance diagram according to an embodiment of the present application;

FIG. 5 is a flowchart of an information processing method according to another embodiment of the present application;

FIG. 6 is a flowchart of an information processing method according to another embodiment of the present application;

FIG. 7 is a schematic structural diagram of an information processing apparatus according to another embodiment of the present application; and FIG. 8 is a schematic diagram of a communications system according to another embodiment of the present application.

DESCRIPTION OF EMBODIMENTS

To facilitate understanding, the following describes some nouns in this application.

In this application, nouns "network" and "system" are usually interchangeably used, and "apparatus" and "device" are also usually interchangeably used, but meanings of the nouns can be understood by a person skilled in the art. A "communications apparatus" may be a chip (such as a baseband chip, a data signal processing chip, or a general-purpose chip), a terminal, a base station, or another network device. The terminal is a device having a communication function, and may include a handheld device, a vehicle-mounted device, a wearable device, or a computing device having a wireless communication function, another processing device connected to a wireless modem, or the like. The terminal may have different names in different networks, such as user equipment, a mobile station, a subscriber unit, a station, a cellular phone, a personal digital assistant, a wireless modem, a wireless communications device, a handheld device, a laptop computer, a cordless phone, and a wireless local loop station. For ease of description, the names are briefly referred to as the terminal in this application. The base station (BS), also referred to as a base station device, is a device deployed in a radio access network to provide a wireless communication function. The base station may be different names in different radio access systems. For example, a base station in a universal mobile telecommunications system (UMTS) network is referred to as a NodeB, a base station in an LTE network is referred to as an evolved NodeB (eNB or eNodeB), and a base station in a new radio (NR) network is referred to as a transmission reception point (TRP) or a next-generation NodeB (gNB). Alternatively, a base station in another evolved network may have another name. This is not limited in the present application.

The following describes technical solutions in the embodiments of the present application with reference to the accompanying drawings in the embodiments of the present application.

Figure 1:
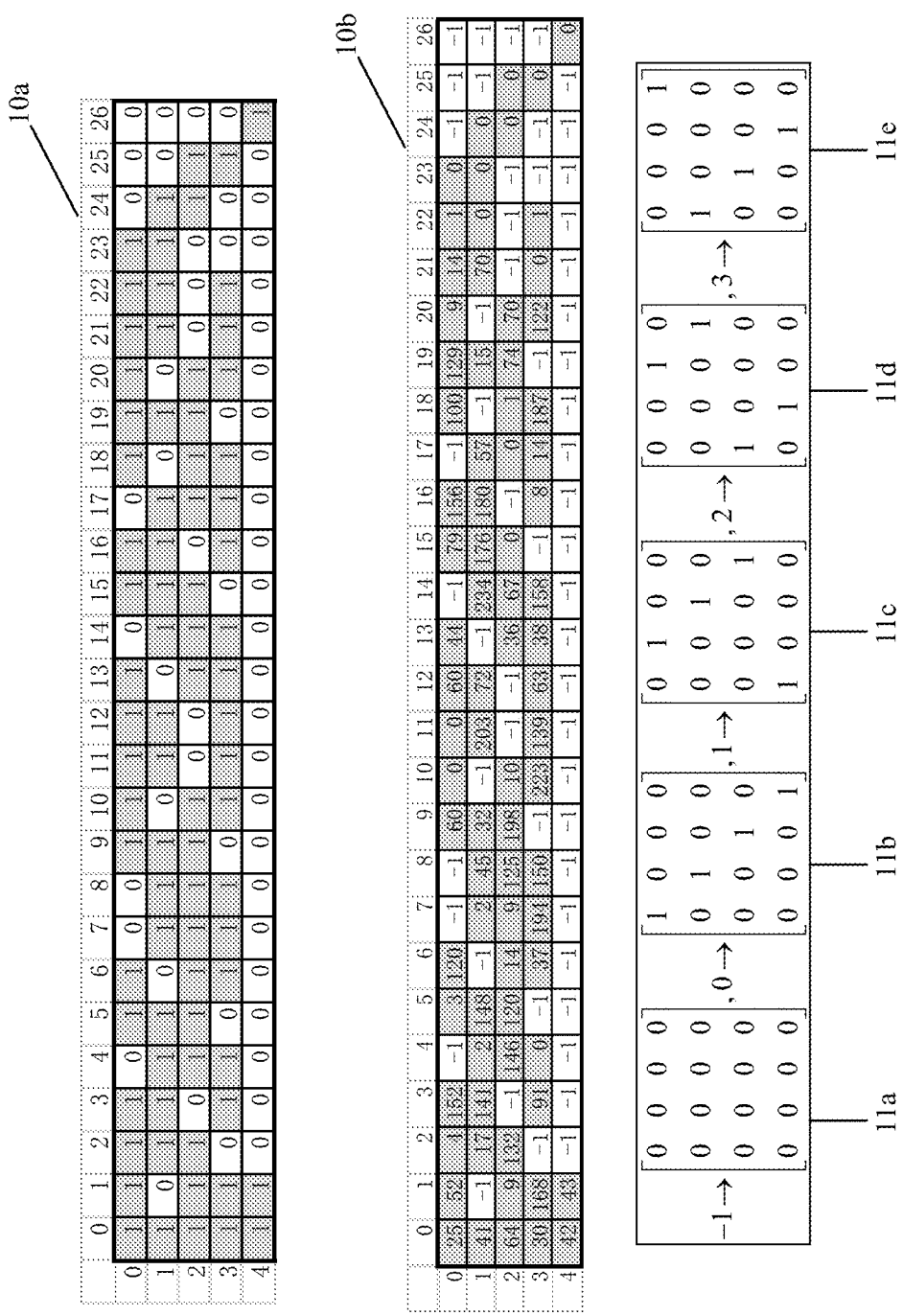
FIG. 1 is a schematic diagram of a base graph and a base matrix of an LDPC code, and a circulant permutation matrix of the base matrix.
Figures 1A, 3B:
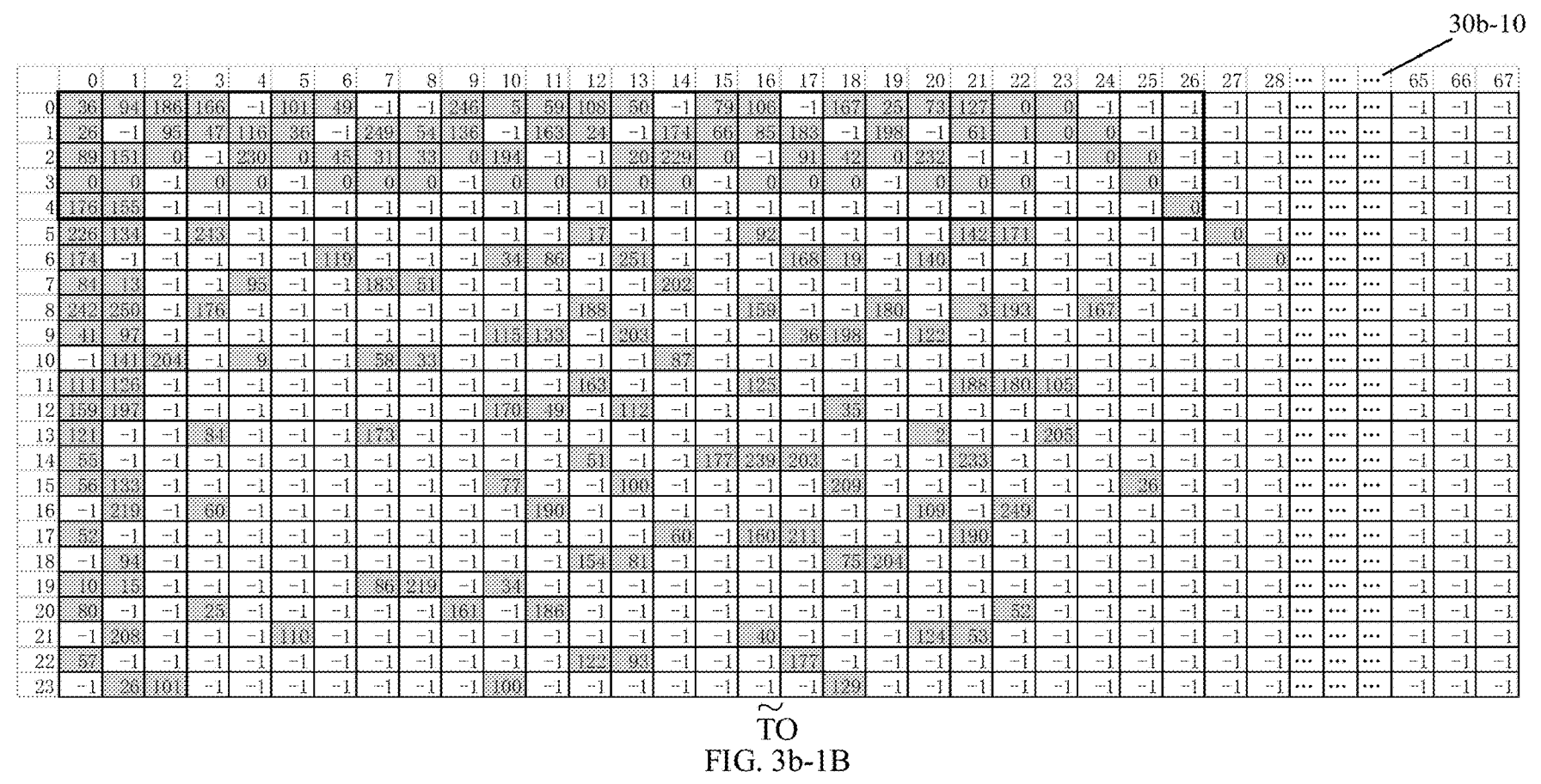
Figures 1B, 3B:
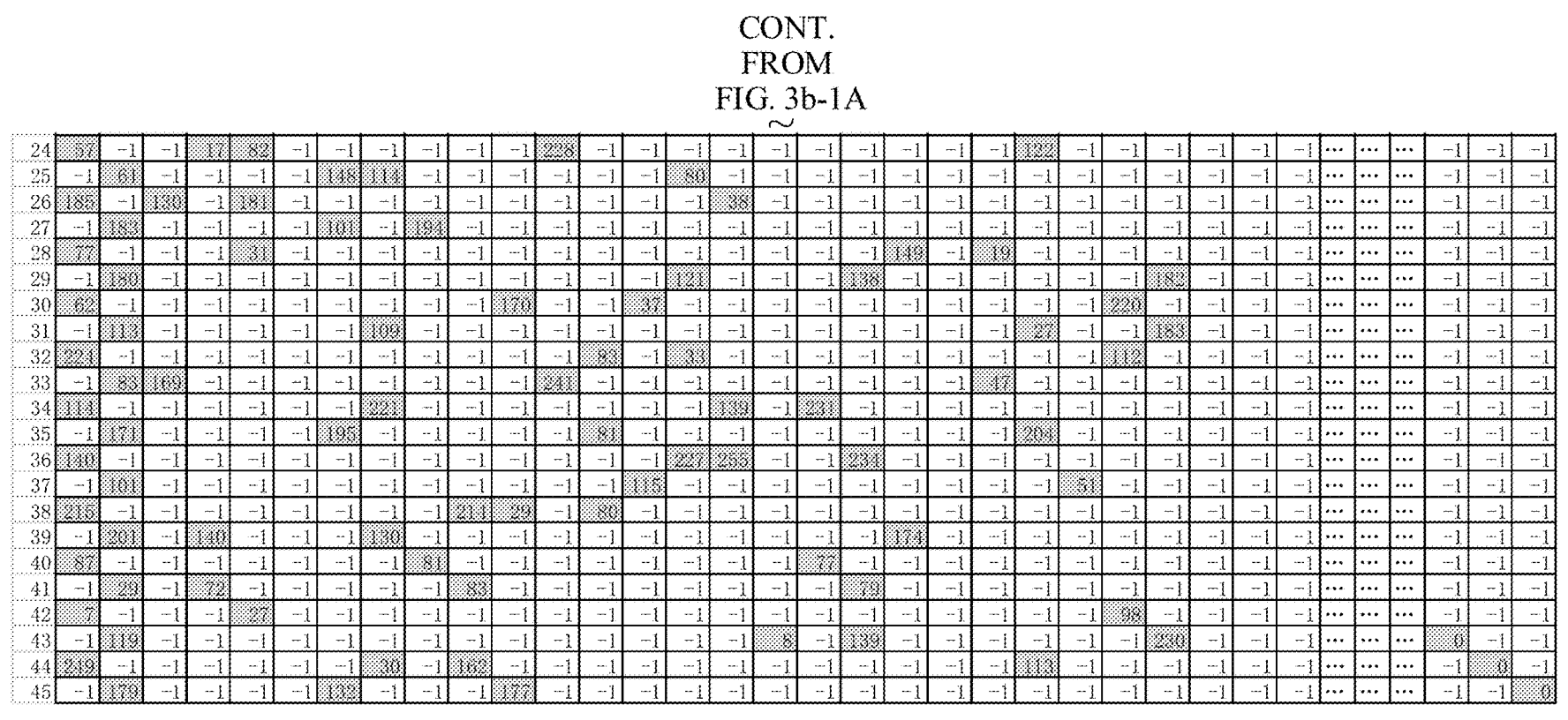

Usually, an LDPC code may be represented by a parity check matrix H. The parity check matrix H of the LDPC code may be obtained by using a base graph and a shift value. The base graph may usually include m×n matrix elements (entry), and may be represented by a matrix with m rows and n columns. A value of a matrix element is 0 or 1. An element whose value is 0 is also referred to as a zero element sometimes, indicating that the element may be replaced with a Z×Z all-zero matrix. An element whose value is 1 is also referred to as a non-zero element sometimes, indicating that the element may be replaced by a Z×Z circulant permutation matrix. In other words, each matrix element represents one all-zero matrix or one circulant permutation matrix. 10a in FIG. 1 shows elements in an example base graph of an LDPC code with a QC structure, where m=5 and n=27. It should be noted that, in this specification, row indexes and column indexes of a base graph and a matrix are numbered from 0. This is merely for ease of description. For example, a column 0 indicates a first column of the base graph and the matrix, a column 1 indicates a second column of the base graph and the matrix, a row 0 indicates a first row of the base graph and the matrix, and a row 1 indicates a second row of the base graph and the matrix, and so on.

It may be understood that, row indexes and column indexes may alternatively be numbered from 1, and in this case, row indexes and column indexes shown in this specification are increased by 1 to obtain corresponding row indexes and column indexes. For example, if the row indexes or the column indexes are numbered from 1, a column 1 indicates a first column of the base graph and the matrix, a column 2 indicates a second column of the base graph and the matrix, a row 1 indicates a first row of the base graph and the matrix, and a row 2 indicates a second row of the base graph and the matrix, and so on.

If a value of an element in a row i and a column j of the base graph is 1, a shift value of the element is $P_{i,j}$, and $P_{i,j}$ is an integer greater than or equal to 0, it indicates that the element, in the row i and the column j, whose value is 1 may be replaced with a Z×Z circulant permutation matrix corresponding to $P_{i,j}$. The circulant permutation matrix may be obtained by performing a right cyclic shift on a Z×Z identity matrix for $P_{i,j}$ times. It may be learned that, in the base graph, each element whose value is 0 is replaced with a Z×Z all-zero matrix, and each element whose value is 1 is replaced with a Z×Z circulant permutation matrix corresponding to a shift value of the element, so that the parity check matrix of the LDPC code can be obtained. Z is a positive integer, may also be referred to as a lifting factor, and may be determined based on a code block size and an information data size that are supported by a system. It may be learned that the parity check matrix H has a size of (m×Z)×(n×Z). For example, if the lifting factor Z is 4, each zero element is replaced with a 4×4 all-zero matrix 11a. If $P_{2,3}=2$, a non-zero element in a row 2 and a column 3 is replaced with a 4×4 circulant permutation matrix 11d, and the matrix is obtained by performing a right cyclic shift on a 4×4 identity matrix 11b twice. If $P_{2,4}=0$, a non-zero element in a row 2 and a column 4 is replaced with the identity matrix 11b. It should be noted that, this is merely an example for description, and the present application is not limited thereto.

Because $P_{i,j}$ may be obtained based on the lifting factor Z, different $P_{i,j}$ may be obtained by using different lifting factors Z for an element whose value is 1 in a same position. To simplify implementation, usually, a base matrix with m rows and n columns, also referred to as a PCM (parity check matrix) sometimes, may further be defined in the system. Each element in the base matrix is in a one-to-one correspondence with a position of each element in the base graph. A position of a zero element in the base graph is the same as that of the zero element in the base matrix, and the zero element may be represented by −1 or a null value "null". A position of the non-zero element, in the row i and the column j in the base graph, whose value is 1 is the same as that of the non-zero element in the base matrix, and the non-zero element may be represented as $P_{i,j}$. $P_{i,j}$ may be a shift value defined relative to a predetermined or particular lifting factor Z. In the embodiments of this application, the base matrix is also referred to as a shift matrix of the base graph matrix sometimes.

10b in FIG. 1 shows a base matrix corresponding to a base graph 10a.

Usually, the base graph or the base matrix of the LDPC code may further include p built-in puncture bit columns. p may be an integer from 0 to 2. These columns are used for encoding, but system bits corresponding to the columns are not sent, so that a code rate of the base matrix of the LDPC code meets R=(n−m)/(n−p). Using the base graph 10a as an example, if there are two built-in puncture bit columns, a code rate is (27−5)/(27−2)=0.88, approximating to 8/9.

An LDPC code used in a wireless communications system is a QC-LDPC code. A parity bit part of the LDPC code has a dual-diagonal structure or a raptor-like structure. This can make encoding simple, and support incremental redundancy hybrid retransmission. In a decoder for the QC-LDPC code, a QC-LDPC shift network (QSN), a Banyan network, or a Benes network is usually used to implement a cyclic shift of information.

A base graph of the QC-LDPC code having the raptor-like structure has a matrix size of m rows and n columns, and may include five submatrices: A, B, C, D, and E. A matrix weight is determined by a quantity of non-zero elements. A row weight is a quantity of non-zero elements included in a row, a column weight is a quantity of non-zero elements included in a column.

Figure 2:
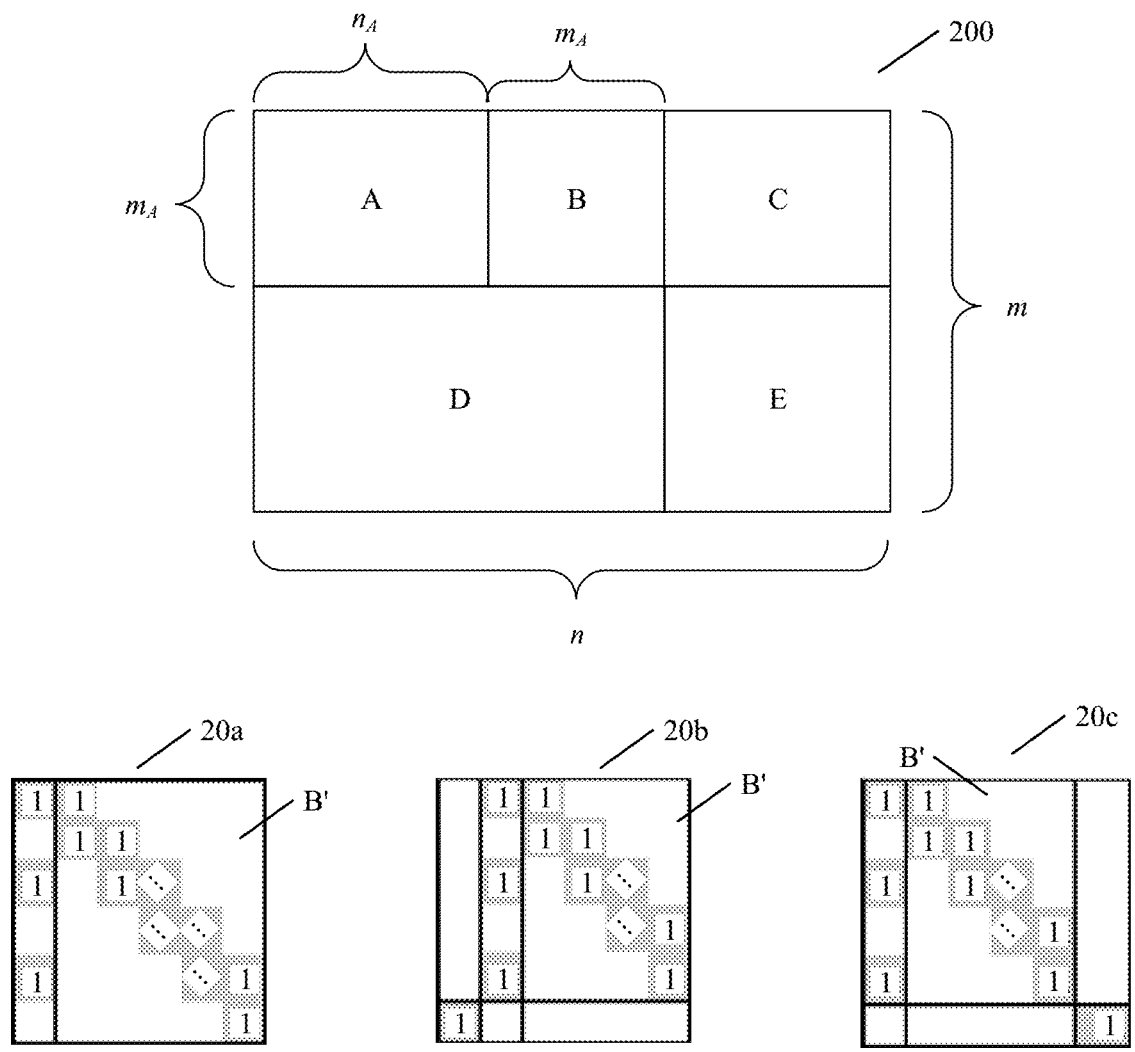
FIG. 2 is a schematic structural diagram of a base graph of an LDPC code.
Figures 2A, 3B:
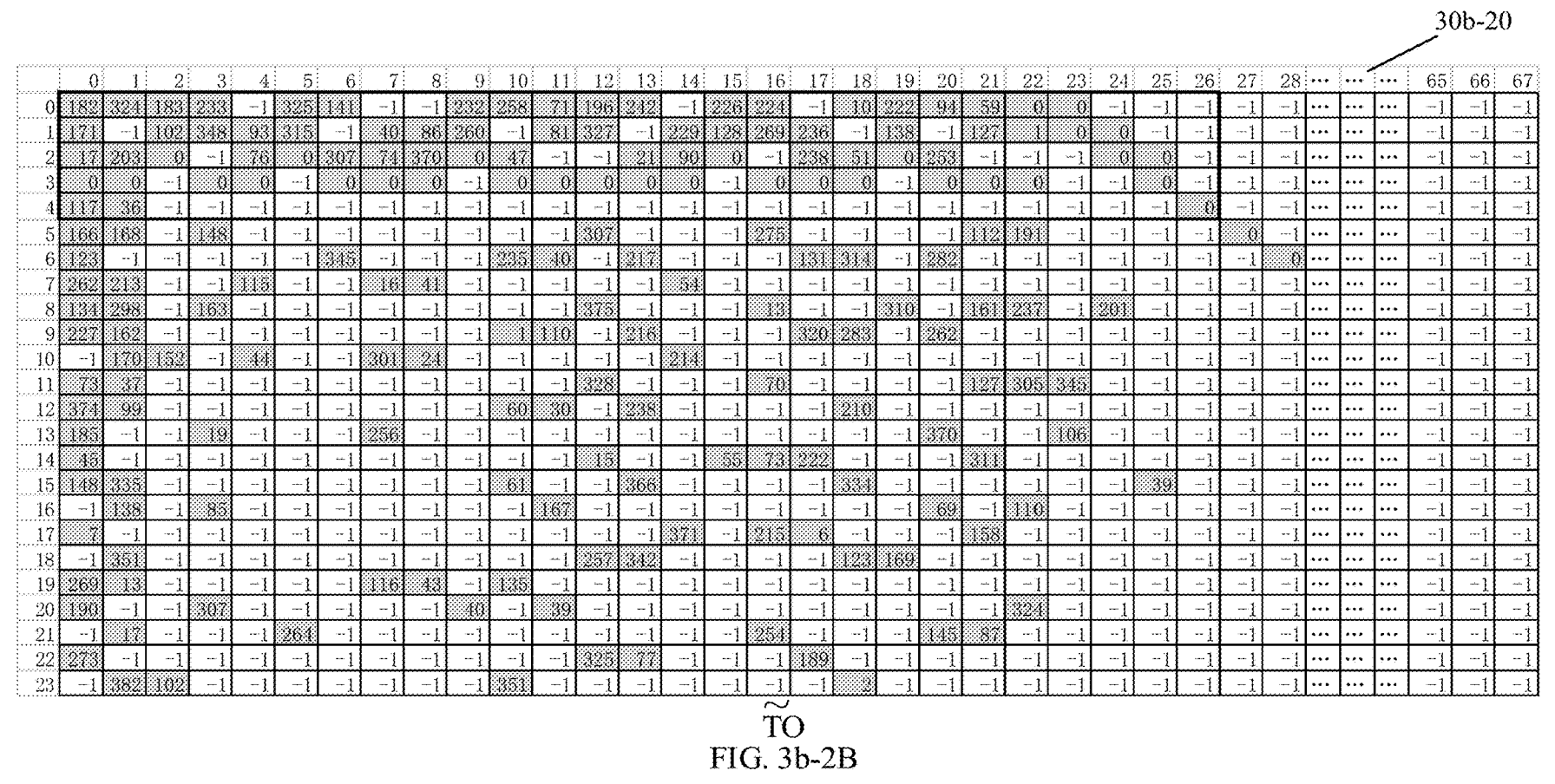
Figures 2B, 3B:
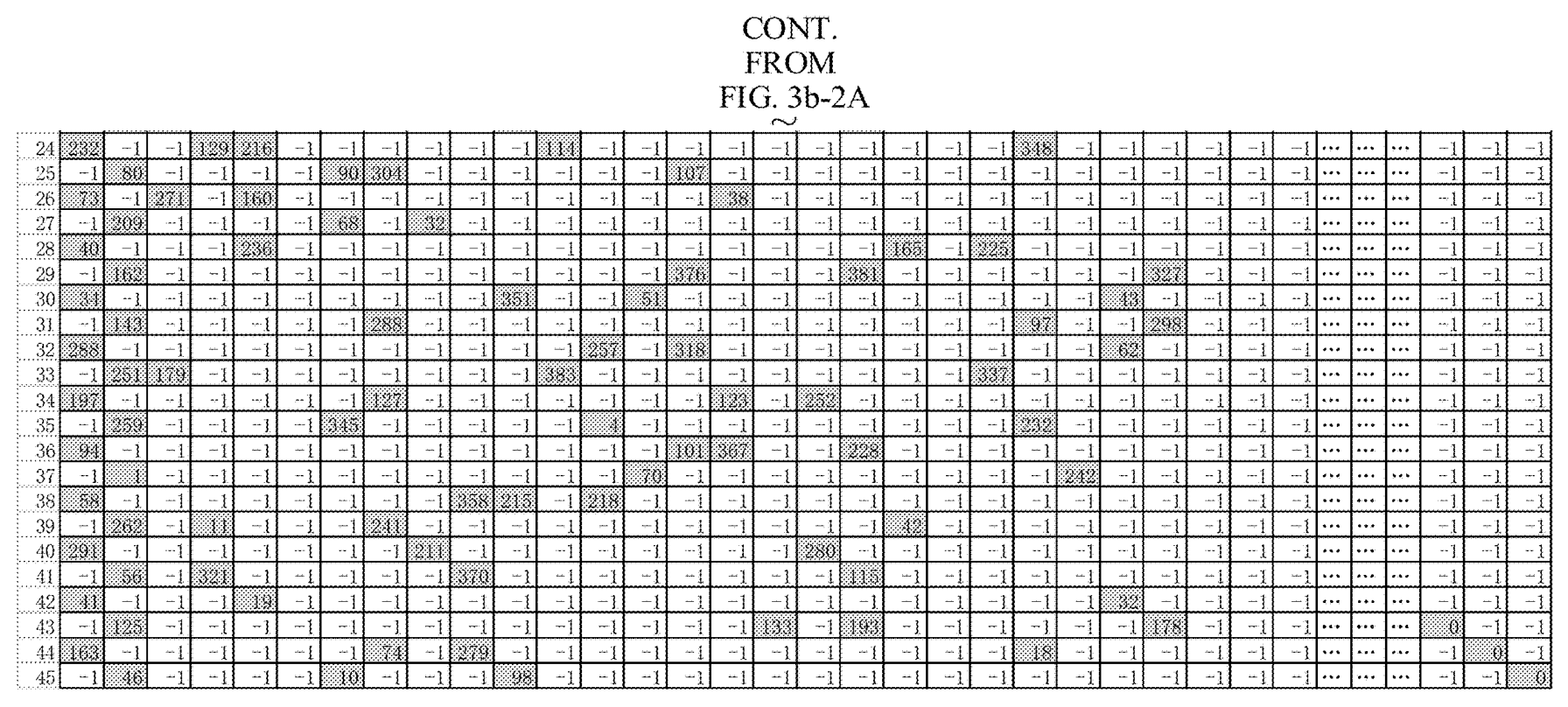

As shown in 200 in FIG. 2, the submatrix A is a matrix with $m_A$ rows and $n_A$ columns, and may have a size of $m_A \times n_A$. Each column corresponds to Z system bits in the LDPC code, and the system bit is also referred to as an information bit sometimes.

The submatrix B is a square matrix with $m_A$ rows and $m_A$ columns, and may have a size of $m_A \times m_A$. Each column corresponds to Z parity bits in the LDPC code. The submatrix B includes a submatrix B' having a dual-diagonal structure and one matrix column whose column weight is 3 (which is referred to as a column having a column weight of 3 for short). The matrix column whose column weight is 3 may be located before the submatrix B', as shown in 20a in FIG. 2. The submatrix B may further include one or more matrix columns whose column weight is 1 (which is referred to as a column having a column weight of 1). For example, a possible embodiment is shown in 20b or 20c in FIG. 2.

Usually, a matrix generated based on the submatrix A and the submatrix B may be referred to as a core matrix, and may be used to support high code-rate encoding.

The submatrix C is an all-zero matrix, and has a size of $m_A \times m_D$.

The submatrix E is an identity matrix, and has a size of $m_D \times m_D$.

The submatrix D has a size of $m_D \times (n_A + m_A)$, and may usually be used to generate parity bits of a low code rate.

Because structures of the submatrix C and the submatrix E are relatively fixed, structures of the submatrix A, the submatrix B, and the submatrix D are one of factors affecting encoding and decoding performance of the LDPC code.

When encoding is performed by using the LDPC matrix having the raptor-like structure, in one embodiment, a matrix including the submatrix A and the submatrix B, that is, the core matrix, may be encoded first, to obtain a parity bit corresponding to the submatrix B, and then the entire matrix is encoded, to obtain parity bits corresponding to the submatrix E. Because the submatrix B may include the submatrix B' having the dual-diagonal structure and the column having a column weight of 1, during the encoding, parity bits corresponding to the dual-diagonal structure may be obtained first, and then parity bits corresponding to the column having a column weight of 1 is obtained.

The following provides an example encoding scheme. It is assumed that the core matrix formed by the submatrix A and the submatrix B is $H_{core}$. The last row and the last column are removed from $H_{core}$, that is, a column having a column weight of 1 and a row in which a non-zero element in the column is located are removed from $H_{core}$, to obtain a matrix $H_{core\text{-}dual}$. Parity bits in $H_{core\text{-}dual}$ are represented by $H_e = [H_{e1}\ H_{e2}]$, $H_{e1}$ represents a column having a column weight of 3, and $H_{e2}$ represents a dual-diagonal structure. According to a definition of the matrix of the LDPC code, $H_{core\text{-}dual} \cdot [S\ P_e]^T = 0$, where S represents an input sequence and is represented by a vector formed by information bits, $P_e$ represents a vector formed by parity bits, and $[S\ P_e]^T$ represents a matrix transpose formed by the input sequence S and $P_e$. In this way, the parity bits corresponding to $H_{core\text{-}dual}$ may first be calculated based on the input sequence S and $H_{core\text{-}dual}$, where the input sequence S includes all information bits; and then the parity bits corresponding to the column having a column weight of 1 in the submatrix B is calculated based on the obtained parity bits corresponding to $H_{core\text{-}dual}$ and the input sequence S. In this case, all parity bits corresponding to the submatrix B may be obtained.

Next, parity bits corresponding to the submatrix E are obtained through encoding by using the submatrix D, based on the input sequence S and the parity bits corresponding to the submatrix B, to obtain all information bits and all parity bits. These bits form an encoded sequence, that is, an LDPC code sequence.

In one embodiment, encoding LDPC code may further include shortening and puncturing operations. Neither a shortened bit nor a punctured bit is sent.

The shortening is usually performed starting from the last information bit and goes forward, and may be performed in different manners. Using a quantity so of shortened bits as an example, the last so bits in the input sequence S may be set to known bits, to obtain an input sequence S'. For example, the bits are set to 0 or null, or some other values. Then, the input sequence S' is encoded by using the LDPC matrix. For another example, the last (so mod Z) bits in the input sequence S may alternatively be set to known bits, to obtain an input sequence S'. For example, the bits are set to 0 or null, or some other values. The last $$\left\lfloor \frac{s_0}{Z} \right\rfloor$$

columns are deleted from the submatrix A to obtain an LDPC matrix H', and the input sequence S' is encoded by using the LDPC matrix H'. In other words, the last $$\left\lfloor \frac{s_0}{Z} \right\rfloor$$

columns in the submatrix A are not used for encoding the input sequence S'. After the encoding is completed, the shortened bits are not sent.

The puncturing may be building a puncture bit in the input sequence or puncturing the parity bit. Usually, a parity bit is also punctured starting from the last parity bit. Certainly, the puncturing may be performed in a puncturing sequence preset in the system. In one embodiment, an input sequence is first encoded, and then the last p parity bits of parity bits are selected based on a quantity p of bits that need to be punctured, or p bits are selected based on the puncturing sequence preset in the system. The p bits are not sent. In one embodiment, p columns of a matrix that correspond to punctured bits and p rows in which non-zero elements in these columns are located may alternatively be determined. These rows and columns are not used for encoding, and therefore, and no corresponding parity bits are generated.

It should be noted that, the encoding scheme is merely used as an example herein, and another encoding scheme known to a person skilled in the art may be used based on the base graph and/or the base matrix provided in this application. This is not limited in this application. Decoding in this application may be performed in a plurality of encoding schemes such as a min-sum (MS) decoding scheme or a belief propagation decoding scheme. The MS decoding scheme is also referred to as a flood MS decoding scheme sometimes. For example, an input sequence is initialized, iteration processing is performed on the initialized input sequence, hard-decision detection is performed after iteration, and a hard-decision result is checked. If a decoding result meets a check equation, decoding succeeds, iteration ends, and the decision result is output. If a decoding result does not meet a check equation, the iteration processing is performed again before a maximum quantity of iteration times is reached, and if the check still fails when the maximum quantity of iteration times is reached, decoding fails. It may be understood that a person skilled in the art may understand a principle of MS decoding. Details are not described herein.

It should be noted that, the decoding scheme is merely an example for description, another decoding scheme known to a person skilled in the art may be used based on the base graph and/or the base matrix provided in this application. The decoding scheme is not limited in this application.

Figure 3A-1:
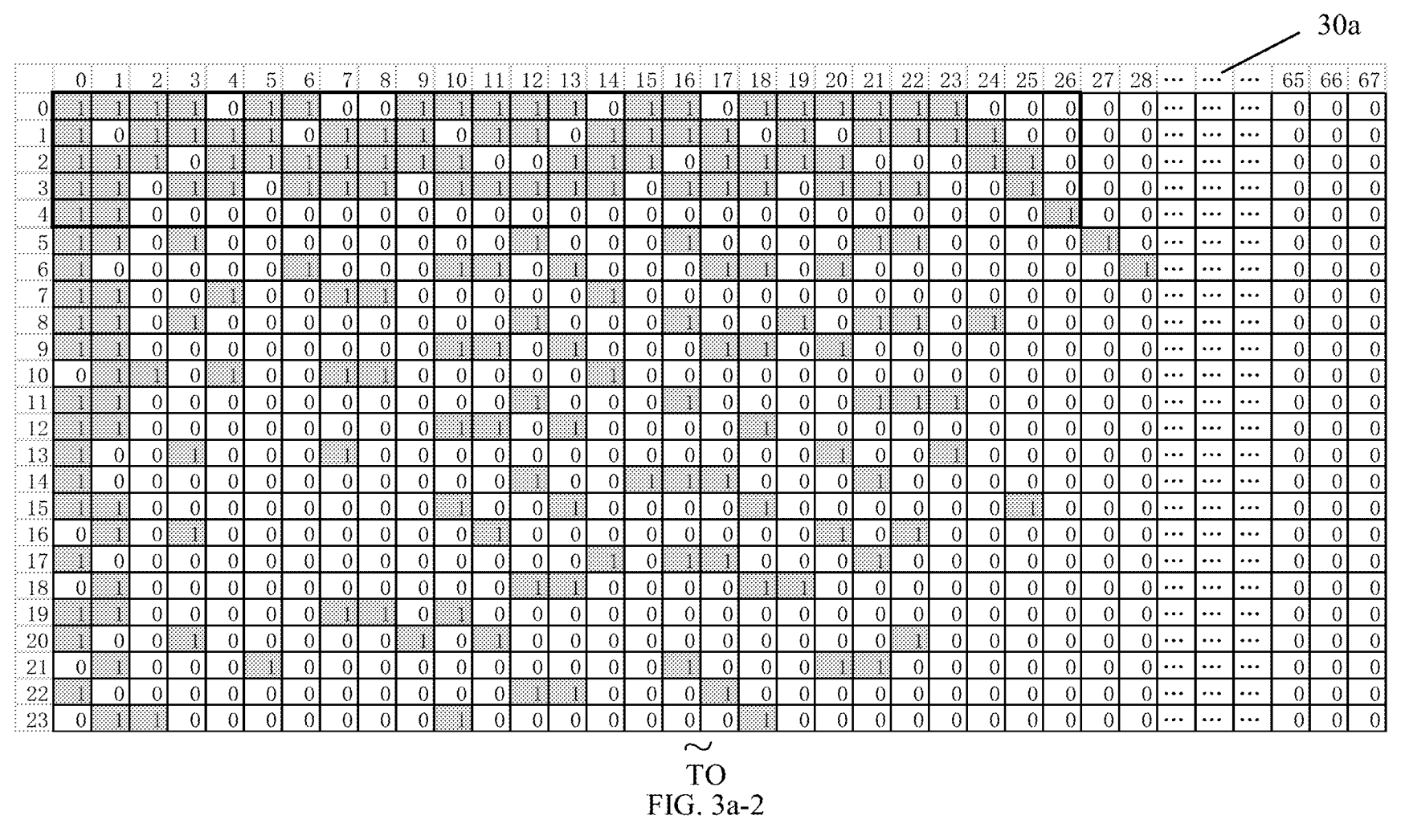
Figure 3A-2:
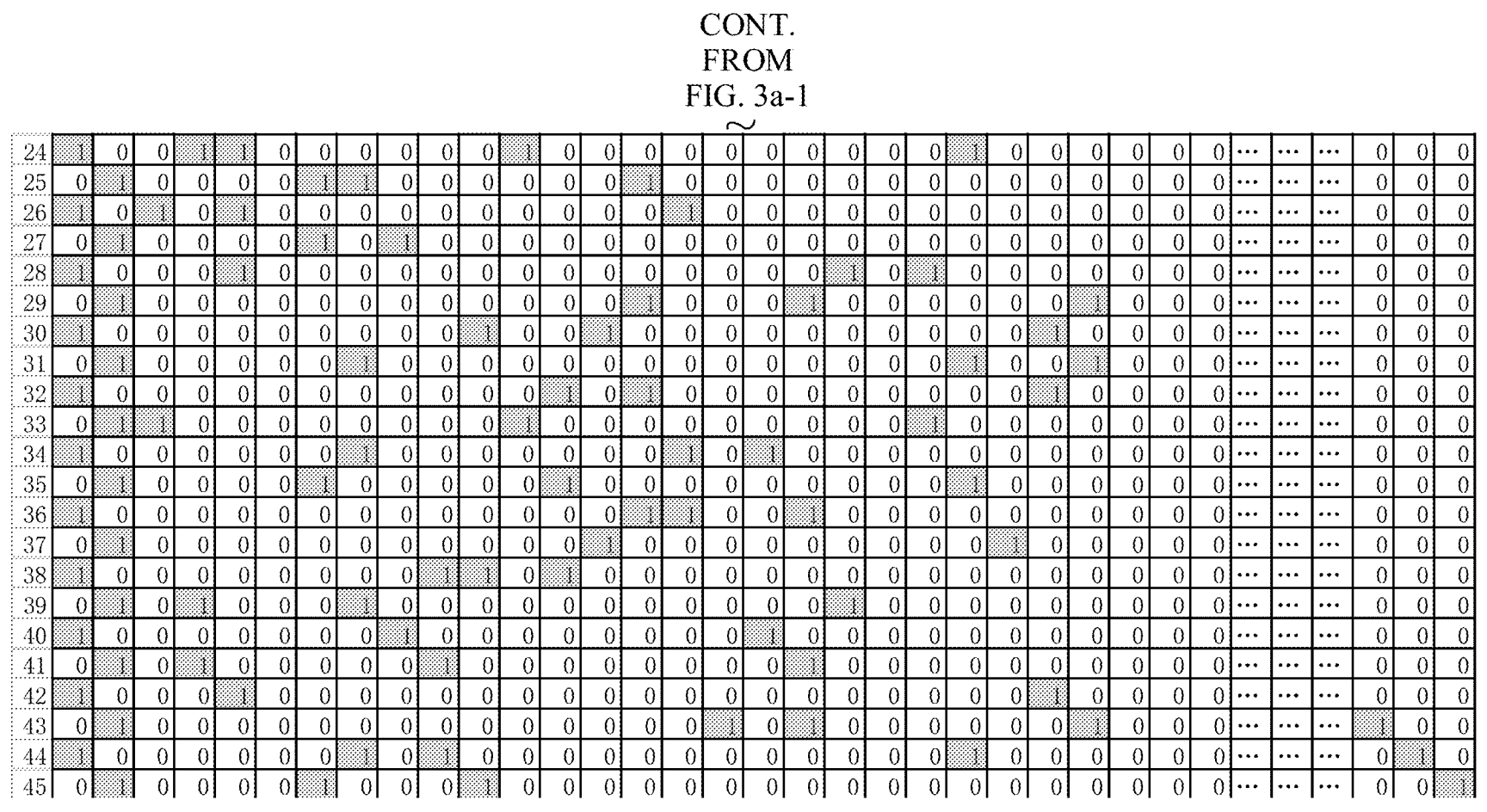

Usually, an LDPC code may be obtained by designing a base graph or a base matrix. For example, a performance upper limit of the LDPC code may be determined by performing a density evolution method on the base graph or the base matrix, and an error floor of the LDPC code is determined based on a shift value in the base matrix. By designing the base graph or the base matrix, encoding or decoding performance can be improved, and an error floor can be reduced. In a wireless communications system, a code length is flexibly variable. For example, the code length may be 2560 bits, 38400 bits, or the like. FIG. 3a-1 and FIG. 3a-2 are an example of a base graph 30a of an LDPC code, and FIG. 3b-1A to FIG. 3b-8B are examples of base matrices of the base graph 30a. The examples meet a performance requirement for a plurality of block lengths. For ease of description and understanding, the top side and the left side of FIG. 3a-1 and FIG. 3a-2, and FIG. 3b-1A to FIG. 3b-8B respectively show column indexes and row indexes.

FIG. 3a-1 and FIG. 3a-2 shows an example of a base graph 30a of an LDPC code. In the figure, 0 to 67 (that is, columns 0 to 67) in the uppermost row indicate column indexes, and 0 to 45 (that is, rows 0 to 45) in the leftmost column indicate row indexes. In other words, a matrix of the base graph 30a has a size of 46 rows and 68 columns.

In one embodiment, the submatrix A and the submatrix B may be considered as the core matrix of the base graph of the LDPC code, and may be used for high code-rate encoding. A matrix with 5 rows and 27 columns is formed. For example, a matrix with 5 rows and 27 columns shown in the base graph 10a may be used as the core matrix of the base graph.

In one embodiment, the submatrix A may include one or more built-in puncture bit columns, for example, may include two built-in puncture bit columns. In this case, after puncturing, a code rate that can be supported by the core matrix is 0.88.

The submatrix B may include one column having a column weight of 3, that is, a column weight of a column 0 of the submatrix B (a column 22 of the core matrix) is 3. A column 1 to a column 3 of the submatrix B (a column 23 to a column 25 of the core matrix) and a row 0 to a row 3 of the submatrix B are a dual-diagonal structure. The submatrix B further includes one column having a column weight of 1 (a column 26 of the core matrix).

In one embodiment, the submatrix A may correspond to system bits, also referred to as information bits sometimes, has a size of $m_A$ rows and 22 columns, where $m_A=5$, and includes elements in a row 0 to a row 4 and a column 0 to a column 21 in the base graph 30a.

In one embodiment, the submatrix B may correspond to parity bits, has a size of $m_A$ rows and $m_A$ columns, and includes elements in a row 0 to a row 4 and a column 22 to a column 26 in the base graph 30a.

To obtain a flexible code rate, a submatrix C, a submatrix D, and a submatrix E of corresponding sizes may be added based on a core matrix, to obtain different code rates. The submatrix C is an all-zero matrix, and the submatrix is an identity matrix. The sizes of the submatrix C and the submatrix D are mainly determined based on the code rate, and the submatrix C and the submatrix D have a relatively fixed structure. The core matrix and the submatrix D mainly affect encoding and decoding performance. Rows and columns are added based on the core matrix to form corresponding C, D, and E, so that different code rates can be obtained.

A quantity $m_D$ of columns of the submatrix D is a sum of quantities of columns of the submatrix A and the submatrix B, and a quantity of rows in the submatrix D is mainly related to a code rate. Using the base graph 30a as an example, a quantity of columns in the submatrix D is 27. If the code rate supported by the LDPC code is $R_m$, the base graph or the base matrix of the LDPC code has a size of m rows and n columns, where $n=n_A/R_m+p$ and $m=n-n_A=n_A/R_m+p-n_A$. If a minimum code rate $R_m$ is 1/3, and a quantity p of built-in puncture columns is 2, using the base graph 30a as an example, n=68 and m=46. A maximum quantity $m_D$ of rows in the submatrix D may be $m-m_A=46-5=41$, and therefore, $0 \leq m_D \leq 41$.

Using the base graph 30a as an example, the submatrix D may include $m_D$ rows of a row 5 to a row 41 in the base graph 30a.

In this application, if there is a maximum of only one non-zero element in two adjacent rows in a same column in a base graph, the two rows are mutually orthogonal. If a maximum of only one non-zero element exists in a same column in columns other than some columns in two adjacent rows in the base graph, the two adjacent rows are quasi-orthogonal. For example, there is only one non-zero element in a column other than a built-in punctured bit column in the two adjacent rows, and it may be considered that the two adjacent rows are quasi-orthogonal.

The row 5 to the row 41 in the base graph 30a may include a plurality of quasi-orthogonal rows and at least two orthogonal rows. For example, the row 5 to the row 41 in the base graph 30a include at least 15 rows meeting the quasi-orthogonal structure, and there is a maximum of only one non-zero element in a same column in columns other than the built-in punctured bit column in any two adjacent rows of the 15 rows. The row 5 to the row 41 in the base graph 30a may further include 10 to 26 rows meeting the orthogonal structure. In other words, in these rows, there is a maximum of only one non-zero element in a same column in any two adjacent rows, that is, there is also a maximum of only one non-zero element in the built-in punctured bit column.

If $m_D=15$, the submatrix D in the base graph of the LDPC code has a size of 15 rows and 27 columns. The submatrix D may be a matrix formed by a row 5 to a row 19 and a column 0 to a column 26 in the base graph 30a. A corresponding code rate supported by the LDPC code is 22/40=0.55. At this code rate, the base graph of the LDPC code corresponds to a matrix formed by a row 0 and a row 19 and a column 0 to a column 41 in the base graph 30a. The submatrix E is an identity matrix with 15 rows and 15 columns, and the submatrix C is an all-zero matrix with five rows and 15 columns.

If $m_D=19$, the submatrix D in the base graph of the LDPC code has a size of 19 rows and 27 columns. The submatrix D may be a matrix formed by a row 5 to a row 23 and a column 0 to a column 26 in the base graph 30a. A corresponding code rate supported by the LDPC code is 22/44=1/2. At this code rate, the base graph of the LDPC code corresponds to a matrix formed by a row 0 and a row 23 and a column 0 to a column 45 in the base graph 30*a*. The submatrix E is an identity matrix with 19 rows and 19 columns, and the submatrix C is an all-zero matrix with five rows and 19 columns.

The rest can be deduced by analogy. Details are not described one by one herein again.

In a design, row/column switching may be performed on the base graph and/or the base matrix, that is, row switching, column switching, or row switching and column switching are performed. The row/column switching operation does not change any row weight or column weight, and a quantity of non-zero elements does not change either. Therefore, a base graph and/or a base matrix obtained through row/column switching have/has limited impact on system performance. In other words, on the whole, impact on the system performance is acceptable and fall within a tolerable range. For example, the performance deteriorates in an allowable range in some scenarios or in some ranges. However, the performance is improved in some scenarios or in some ranges. On the whole, there is little impact on the performance.

For example, in the base graph 30*a*, a row 34 may be switched with a row 36, and a column 44 may be switched with a column 45. For another example, the submatrix D includes $m_D$ rows in a matrix F. The $m_D$ rows may not be switched with each other, or one or more of the rows may be switched, and the submatrix E is still of a diagonal structure and neither row switching nor column switching is performed in the submatrix E. For example, a row 27 is switched with a row 29 in the matrix F. The submatrix D includes the $m_D$ rows in the matrix F, and the submatrix E is still of a diagonal structure. It may be understood that, if the base graph or the base matrix includes the submatrix D, when columns in the core matrix are switched, corresponding columns in the submatrix D also need to be switched.

As shown in FIG. 3*b*-1A to FIG. 3*b*-8B, matrices 30*b*-10 to 30*b*-80 are designs of a plurality of base matrices of the base graph 30*a*. A location of a non-zero element in a row i and a column j in the base graph 30*a* is the same as that of the non-zero element in each of the matrices 30*b*-10 to 30*b*-80. A value of the non-zero element is a shift value $V_{i,j}$, and a zero element is represented as −1 or null in a shift matrix. A part corresponding to the submatrix D in the base matrix may include $m_D$ rows of a row 5 to a row 45 in any base matrix, and a value of $m_D$ may be selected based on different code rates. It may be understood that, if the base graph is a matrix obtained by performing a row/column transform relative to base graph 30*a*, the base matrix is also a matrix obtained by performing a row/column transform relative to any one of the matrices 30*b*-10 to 30*b*-80 correspondingly.

In one embodiment, the base matrix of the LDPC code may include a row 0 to a row 4 and a column 0 to a column 26 in any one of the matrices 30*b*-10 to 30*b*-80 shown in FIG. 3*b*-1A to FIG. 3*b*-8B. In this case, a matrix formed by a row 0 to a row 4 and a column 0 to a column 26 in any one of the matrices shown in FIG. 3*b*-1A to FIG. 3*b*-8B may be used as a core part of the base matrix. In this design, other parts of the base matrix of the LDPC code, for example, the matrix C, D, and E, do not have limited structures, for example, may be of any structure shown in FIG. 3*b*-1A to FIG. 3*b*-8B, or may use other matrix designs.

In one embodiment, the base matrix of the LDPC code may include a matrix formed by a row 0 to a row (m−1) and a column 0 to a column (n−1) in any one of the matrices 30*b*-10 to 30*b*-80 shown in FIG. 3*b*-1A to FIG. 3*b*-8B, where 5≤m≤46, m is an integer, 27≤n≤68, and n is an integer.

In this embodiment, other parts of the base matrix of the LDPC code do not have limited structures, for example, may have any structure shown in FIG. 3*b*-1A to FIG. 3*b*-8B, or may use other matrix designs.

In one embodiment, the base matrix of the LDPC code may include a matrix formed by a row 0 to a row 4 and some of a column 0 to a column 26 in any one of the matrices 30*b*-10 to 30*b*-80 shown in FIG. 3*b*-1A to FIG. 3*b*-8B. For example, core parts (the row 0 to the row 4 and the column 0 to the column 26) of the matrices shown in FIG. 3*b*-1A to FIG. 3*b*-8B may be shortened and/or punctured. In one embodiment, the base matrix of the LDPC code may not include columns corresponding to shorten and/or punctured bits.

In this design, other parts of the base matrix of the LDPC code are not limited, for example, may have structures shown in FIG. 3*b*-1A to FIG. 3*b*-8B, or may have other structures.

In one embodiment, the base matrix of the LDPC code may include a matrix formed by a row 0 to a row (m−1) and some of a column 0 to a column (n−1) in any one of the matrices 30*b*-10 to 30*b*-80 shown in FIG. 3*b*-1A to FIG. 3*b*-8B, where 5≤m≤46, m is an integer, 27≤n≤68, and n is an integer. For example, the row 0 to the row (m−1) and the column 0 to the column (n−1) in any one of the matrices 30*b*-10 to 30*b*-80 shown in FIG. 3*b*-1A to FIG. 3*b*-8B may be shortened (shortening) and/or punctured (puncturing). In one embodiment, the base matrix of the LDPC code may not include columns corresponding to shorten and/or punctured bits. In this design, other parts of the base matrix of the LDPC code are not limited, for example, may have structures shown in FIG. 3*b*-1A to FIG. 3*b*-8B, or may have other structures.

In one embodiment, the shortening operation may be shortening an information bit. Using any one of the matrices shown in FIG. 3*b*-1A to FIG. 3*b*-8B as an example, one or more columns of columns 0 to 21 are shortened, so that the base matrix of the LDPC code may not include the one or more shortened columns in any one of the matrices shown in FIG. 3*b*-1A to FIG. 3*b*-8B. For example, if the column 21 is shortened, the base matrix of the LDPC code may include: the columns 0 to 20 and columns 22 to 26 in any one of matrices 30*b*-10 to 30*b*-80. For the row 0 to the row 4, the column 0 to the column 20, and the column 22 to the column 26, a code rate is 7/8.

In one embodiment, the puncturing may be puncturing a parity bit. Using any one of the matrices shown in FIG. 3*b*-1A to FIG. 3*b*-8B as an example, one or more of the column 22 to the column 26 are punctured. In this case, the base matrix of the LDPC code may not include one or more of punctured columns in any one of the matrices shown in FIG. 3*b*-1A to FIG. 3*b*-8B. For example, if the column 26 is punctured, the base matrix of the LDPC code may include the column 0 to the column 25 in any one of the matrices 30*b*-10 to 30*b*-80.

Different lifting factors Z are designed for the LDPC code, to support information bit sequences of different lengths. In one embodiment, different base matrices may be used for the different lifting factors, to obtain better performance. For example, the lifting factor $z=a\times 2^j$, $0\leq j<7$, and a {2, 3, 5, 7, 9, 11, 13, 15}. Table 1 is a possible supported lifting factor set {2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}. Other than the uppermost row and the leftmost column, each cell indicates a value of Z corresponding to values of a and j. For example, when a=2 and j=1, Z=4. For another example, when a=11 and j=3, Z=88. The rest can be deduced by analogy. Details are not described again.

TABLE 1

| Z     | a = 2 | a = 3 | a = 5 | a = 7 | a = 9 | a = 11 | a = 13 | a = 15 |
|-------|-------|-------|-------|-------|-------|--------|--------|--------|
| j = 0 | 2     | 3     | 5     | 7     | 9     | 11     | 13     | 15     |
| j = 1 | 4     | 6     | 10    | 14    | 18    | 22     | 26     | 30     |
| j = 2 | 8     | 12    | 20    | 28    | 36    | 44     | 52     | 60     |
| j = 3 | 16    | 24    | 40    | 56    | 72    | 88     | 104    | 120    |
| j = 4 | 32    | 48    | 80    | 112   | 144   | 176    | 208    | 240    |
| j = 5 | 64    | 96    | 160   | 224   | 288   | 352    |        |        |
| j = 6 | 128   | 192   | 320   |       |       |        |        |        |
| j = 7 | 256   | 384   |       |       |       |        |        |        |

The lifting factor set supported by the base graph may include all or some of lifting factors in Table 1. For example, the lifting factor set may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}, that is, Z is greater than or equal to 24. For another example, the lifting factor set may be a union set of one or more of {2, 3, 4, 5, 6, 7, 8, 9, 10, 11, 12, 13, 14, 15, 16, 18, 20, 22} and {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}. It should be noted that this is merely an example herein. The lifting factor set supported by the base graph may be divided into different subsets based on a value of a. For example, if a=2, a subset of the lifting factor Z may include one or more of {2, 4, 8, 16, 32, 64, 128, 256}. For another example, if a=3, a subset of the lifting factor Z may include one or more of {3, 6, 12, 24, 48, 96, 192, 384}. The rest can be deduced by analogy.

The lifting factor set supported by the base graph may be divided based on different values of a, to determine a corresponding base matrix.

If a=2, or when a value of the lifting factor Z is one of {2, 4, 8, 16, 32, 64, 128, 256}, the base matrix may include a row 0 to a row 4 and a column 0 to a column 26 in the matrix 30b-10; or the base matrix includes a row 0 to a row (m−1) and a column 0 to a column (n−1) in the matrix 30b-10, where 5≤m≤46, m is an integer, 27≤n≤68, and n is an integer; or the base matrix includes a row 0 to a row (m−1) and some of a column 0 to a column (n−1) in the matrix 30b-10, where 5≤m≤46, m is an integer, 27≤n≤68, and n is an integer.

If a=3, or when a value of the lifting factor Z is one of {3, 6, 12, 24, 48, 96, 192, 384}, the base matrix may include a row 0 to a row 4 and a column 0 to a column 26 in the matrix 30b-20; or the base matrix includes a row 0 to a row (m−1) and a column 0 to a column (n−1) in the matrix 30b-20, where 5≤m≤46, m is an integer, 27≤n≤68, and n is an integer; or the base matrix includes a row 0 to a row (m−1) and some of a column 0 to a column (n−1) in the matrix 30b-20, where 5≤m≤46, m is an integer, 27≤n≤68, and n is an integer.

If a=5, or when a value of the lifting factor Z is one of {5, 10, 20, 40, 80, 160, 320}, the base matrix may include a row 0 to a row 4 and a column 0 to a column 26 in the matrix 30b-30; or the base matrix includes a row 0 to a row (m−1) and a column 0 to a column (n−1) in the matrix 30b-30, where 5≤m≤46, m is an integer, 27≤n≤68, and n is an integer; or the base matrix includes a row 0 to a row (m−1) and some of a column 0 to a column (n−1) in the matrix 30b-30, where 5≤m≤46, m is an integer, 27≤n≤68, and n is an integer.

If a=7, or when a value of the lifting factor Z is one of {7, 14, 28, 56, 112, 224}, the base matrix may include a row 0 to a row 4 and a column 0 to a column 26 in the matrix 30b-40; or the base matrix includes a row 0 to a row (m−1) and a column 0 to a column (n−1) in the matrix 30b-40, where 5≤m≤46, m is an integer, 27≤n≤68, and n is an integer; or the base matrix includes a row 0 to a row (m−1) and some of a column 0 to a column (n−1) in the matrix 30b-40, where 5≤m≤46, m is an integer, 27≤n≤68, and n is an integer.

If a=9, or when a value of the lifting factor Z is one of {9, 18, 36, 72, 144, 288}, the base matrix may include a row 0 to a row 4 and a column 0 to a column 26 in the matrix 30b-50; or the base matrix includes a row 0 to a row (m−1) and a column 0 to a column (n−1) in the matrix 30b-50, where 5≤m≤46, m is an integer, 27≤n≤68, and n is an integer; or the base matrix includes a row 0 to a row (m−1) and some of a column 0 to a column (n−1) in the matrix 30b-50, where 5≤m≤46, m is an integer, 27≤n≤68, and n is an integer.

If a=11, or when a value of the lifting factor Z is one of {11, 22, 44, 88, 176, 352}, the base matrix may include a row 0 to a row 4 and a column 0 to a column 26 in the matrix 30b-60; or the base matrix includes a row 0 to a row (m−1) and a column 0 to a column (n−1) in the matrix 30b-60, where 5≤m≤46, m is an integer, 27≤n≤68, and n is an integer; or the base matrix includes a row 0 to a row (m−1) and some of a column 0 to a column (n−1) in the matrix 30b-60, where 5≤m≤46, m is an integer, 27≤n≤68, and n is an integer.

If a=13, or when a value of the lifting factor Z is one of {13, 26, 52, 104, 208}, the base matrix may include a row 0 to a row 4 and a column 0 to a column 26 in the matrix 30b-70; or the base matrix includes a row 0 to a row (m−1) and a column 0 to a column (n−1) in the matrix 30b-70, where 5≤m≤46, m is an integer, 27≤n≤68, and n is an integer; or the base matrix includes a row 0 to a row (m−1) and some of a column 0 to a column (n−1) in the matrix 30b-70, where 5≤m≤46, m is an integer, 27≤n≤68, and n is an integer.

If a=15, or when a value of the lifting factor Z is one of {15, 30, 60, 120, 240}, the base matrix may include a row 0 to a row 4 and a column 0 to a column 26 in the matrix 30b-80; or the base matrix includes a row 0 to a row (m−1) and a column 0 to a column (n−1) in the matrix 30b-80, where 5≤m≤46, m is an integer, 27≤n≤68, and n is an integer; or the base matrix includes a row 0 to a row (m−1) and some of a column 0 to a column (n−1) in the matrix 30b-80, where 5≤m≤46, m is an integer, 27≤n≤68, and n is an integer.

In one embodiment, for a given base matrix of an LDPC code, shift values of non-zero elements in one or more columns in the matrix may be increased or decreased by an offset $Offset_s$. There is little impact on system performance. Compensation values for non-zero elements in different columns may be the same or different. For example, one or more columns in a matrix are compensated, and offsets for different columns may be the same or different. This is not limited in this application.

That there is little impact on system performance means that the impact on the system performance is acceptable and falls within a tolerance range. For example, the performance deteriorates in an allowable range in some scenarios or in some ranges. However, the performance is improved in some scenarios or in some ranges. On the whole, there is little impact on the performance.

For example, a compensation matrix Hs of the matrix may be obtained by increasing or decreasing, by an offset $Offset_s$, each shift value that is greater than or equal to 0 and that is in a column s in any one of the matrices 30b-10 to 30b-80, where $Offset_s$ represents an integer greater than or equal to 0, and $0 \leq s < 23$. $Offset_s$ for one or more columns may be the same or different.

Figure 4:
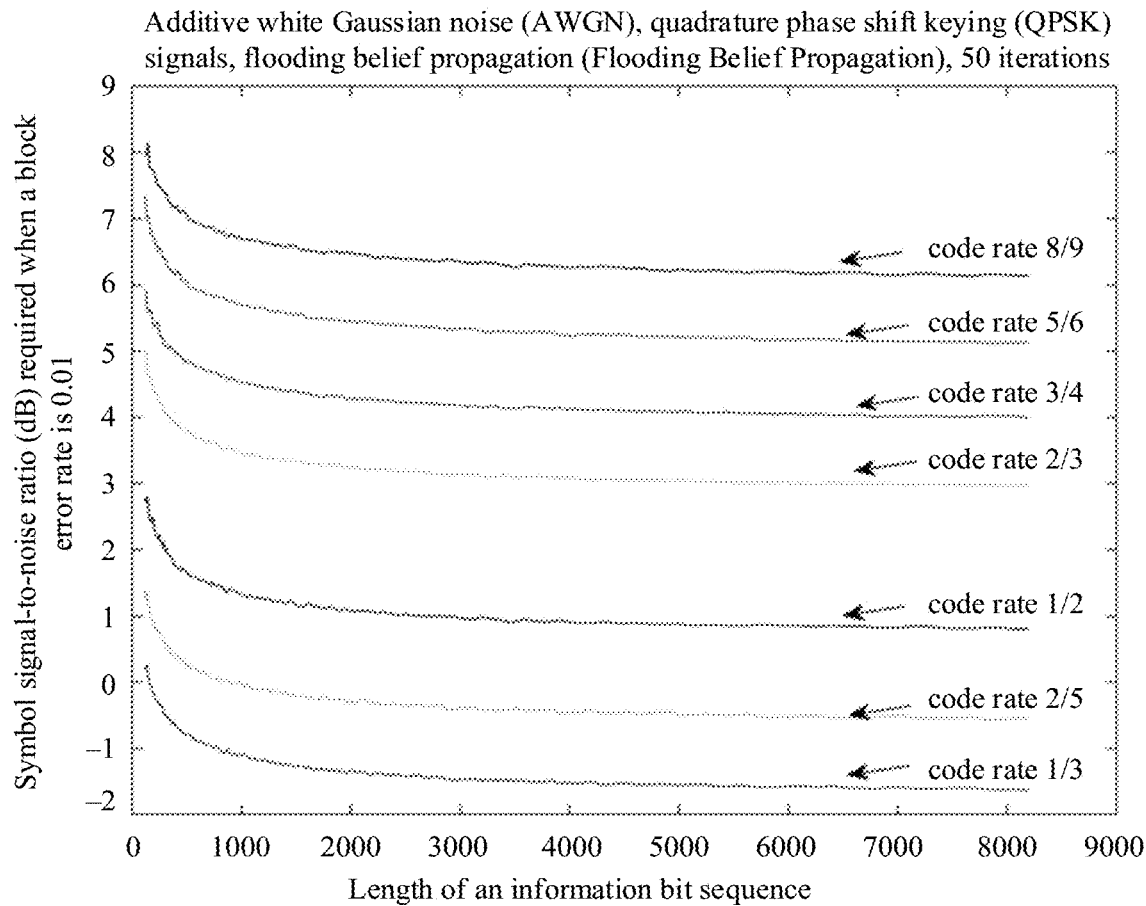

A performance diagram shown in FIG. 4 is a decoding performance curve obtained after QPSK modulation and 50 iterations are performed, through an AWGN channel, on an LDPC code that is encoded based on the matrices 30b-10 to 30b-80. The horizontal coordinate indicates a length of an information bit sequence in a unit of bit, and the vertical coordinate indicates a symbol signal-to-noise ratio (Es/N0) required when a corresponding BLER=0.01, where $120 \leq K \leq 8192$, code rates are 1/3, 2/5, 1/2, 2/3, 3/4, 5/6, and 8/9. The curve is smooth, indicating that the matrix has good performance in different block lengths.

FIG. 1 to FIG. 3a-1 and FIG. 3a-2, and FIG. 3b-1A to FIG. 3b-8B show structures of base graphs and base matrices of the LDPC code. To fully describe a design of the base graph and/or the base matrix in the embodiments of the present application, Table 2-10 to Table 2-11 below may be used for further description.

In a design, the base graph in 10a in FIG. 1 is a matrix with five rows and 27 columns, and parameters of the matrix may be represented by Table 2-10.

TABLE 2-10

| Row index (row index) | Row weight (row degree/ row weight) | Columns in which non-zero elements are located (column position of non-zero elements in row) |
|---|---|---|
| 0 | 19 | 0, 1, 2, 3, 5, 6, 9, 10, 11, 12, 13, 15, 16, 18, 19, 20, 21, 22, 23 |
| 1 | 19 | 0, 2, 3, 4, 5, 7, 8, 9, 11, 12, 14, 15, 16, 17, 19, 21, 22, 23, 24 |
| 2 | 19 | 0, 1, 2, 4, 5, 6, 7, 8, 9, 10, 13, 14, 15, 17, 18, 19, 20, 24, 25 |
| 3 | 19 | 0, 1, 3, 4, 6, 7, 8, 10, 11, 12, 13, 14, 16, 17, 18, 20, 21, 22, 25 |
| 4 | 3 | 0, 1, 26 |

In a design, a size of the base matrix shown in 10b in FIG. 1 is a matrix with five rows and 27 columns, and parameters of the base matrix may be represented by Table 2-11.

TABLE 2-11

| Row index (row index) | Row weight (row degree/row weight) | Columns in which non-zero elements are located (column position of non-zero elements in row) | Shift values of the non-zero elements (shift values of non-zeros elements in row) |
|---|---|---|---|
| 0 | 19 | 0, 1, 2, 3, 5, 6, 9, 10, 11, 12, 13, 15, 16, 18, 19, 20, 21, 22, 23 | 36, 94, 186, 166, 101, 49, 246, 5, 59, 108, 50, 79, 106, 167, 25, 73, 127, 0, 0 |
| 1 | 19 | 0, 2, 3, 4, 5, 7, 8, 9, 11, 12, 14, 15, 16, 17, 19, 21, 22, 23, 24 | 26, 95, 47, 116, 36, 249, 54, 136, 163, 24, 174, 66, 85, 183, 198, 61, 1, 0, 0 |
| 2 | 19 | 0, 1, 2, 4, 5, 6, 7, 8, 9, 10, 13, 14, 15, 17, 18, 19, 20, 24, 25 | 89, 151, 0, 230, 0, 45, 31, 33, 0, 194, 20, 229, 0, 91, 42, 0, 232, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 176, 155, 0 |

In a design, the matrix 30b-10 in FIG. 3b-1A and FIG. 3b-1B may be represented by Table 3-10.

TABLE 3-10

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 36, 94, 186, 166, 101, 49, 246, 5, 59, 108, 50, 79, 106, 167, 25, 73, 127, 0, 0 |
| 1 | 19 | 0, 2, 3, 4, 5, 7, 8, 9, 11, 12, 14, 15, 16, 17, 19, 21, 22, 23, 24 | 26, 95, 47, 116, 36, 249, 54, 136, 163, 24, 174, 66, 85, 183, 198, 61, 1, 0, 0 |
| 2 | 19 | 0, 1, 2, 4, 5, 6, 7, 8, 9, 10, 13, 14, 15, 17, 18, 19, 20, 24, 25 | 89, 151, 0, 230, 0, 45, 31, 33, 0, 194, 20, 229, 0, 91, 42, 0, 232, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 176, 155, 0 |
| 5 | 8 | 0, 1, 3, 12, 16, 21, 22, 27 | 226, 134, 243, 17, 92, 142, 171, 0 |
| 6 | 9 | 0, 6, 10, 11, 13, 17, 18, 20, 28 | 174, 119, 34, 86, 251, 168, 19, 140, 0 |
| 7 | 7 | 0, 1, 4, 7, 8, 14, 29 | 84, 13, 95, 183, 51, 202, 0 |
| 8 | 10 | 0, 1, 3, 12, 16, 19, 21, 22, 24, 30 | 242, 250, 176, 188, 159, 180, 3, 193, 167, 0 |
| 9 | 9 | 0, 1, 10, 11, 13, 17, 18, 20, 31 | 41, 97, 115, 133, 203, 36, 198, 122, 0 |
| 10 | 7 | 1, 2, 4, 7, 8, 14, 32 | 141, 204, 9, 58, 33, 87, 0 |
| 11 | 8 | 0, 1, 12, 16, 21, 22, 23, 33 | 111, 126, 163, 125, 188, 180, 105, 0 |
| 12 | 7 | 0, 1, 10, 11, 13, 18, 34 | 159, 197, 170, 49, 112, 35, 0 |
| 13 | 6 | 0, 3, 7, 20, 23, 35 | 121, 84, 173, 2, 205, 0 |
| 14 | 7 | 0, 12, 15, 16, 17, 21, 36 | 55, 51, 177, 239, 203, 233, 0 |
| 15 | 7 | 0, 1, 10, 13, 18, 25, 37 | 56, 133, 77, 100, 209, 26, 0 |
| 16 | 6 | 1, 3, 11, 20, 22, 38 | 219, 60, 190, 109, 249, 0 |
| 17 | 6 | 0, 14, 16, 17, 21, 39 | 52, 60, 160, 211, 190, 0 |
| 18 | 6 | 1, 12, 13, 18, 19, 40 | 94, 154, 81, 75, 204, 0 |
| 19 | 6 | 0, 1, 7, 8, 10, 41 | 10, 15, 86, 219, 34, 0 |
| 20 | 6 | 0, 3, 9, 11, 22, 42 | 80, 25, 161, 186, 52, 0 |
| 21 | 6 | 1, 5, 16, 20, 21, 43 | 208, 110, 40, 124, 53, 0 |
| 22 | 5 | 0, 12, 13, 17, 44 | 57, 122, 93, 177, 0 |
| 23 | 5 | 1, 2, 10, 18, 45 | 26, 101, 100, 129, 0 |
| 24 | 6 | 0, 3, 4, 11, 22, 46 | 57, 17, 82, 228, 122, 0 |
| 25 | 5 | 1, 6, 7, 14, 47 | 61, 148, 114, 80, 0 |
| 26 | 5 | 0, 2, 4, 15, 48 | 185, 130, 181, 38, 0 |
| 27 | 4 | 1, 6, 8, 49 | 183, 101, 194, 0 |
| 28 | 5 | 0, 4, 19, 21, 50 | 77, 31, 149, 19, 0 |
| 29 | 5 | 1, 14, 18, 25, 51 | 180, 121, 138, 182, 0 |
| 30 | 5 | 0, 10, 13, 24, 52 | 62, 170, 37, 220, 0 |
| 31 | 5 | 1, 7, 22, 25, 53 | 113, 109, 27, 183, 0 |
| 32 | 5 | 0, 12, 14, 24, 54 | 224, 83, 33, 112, 0 |
| 33 | 5 | 1, 2, 11, 21, 55 | 83, 169, 241, 47, 0 |
| 34 | 5 | 0, 7, 15, 17, 56 | 114, 221, 139, 231, 0 |
| 35 | 5 | 1, 6, 12, 22, 57 | 171, 195, 81, 204, 0 |
| 36 | 5 | 0, 14, 15, 18, 58 | 140, 227, 255, 234, 0 |
| 37 | 4 | 1, 13, 23, 59 | 101, 115, 51, 0 |
| 38 | 5 | 0, 9, 10, 12, 60 | 215, 214, 29, 80, 0 |
| 39 | 5 | 1, 3, 7, 19, 61 | 201, 140, 130, 174, 0 |
| 40 | 4 | 0, 8, 17, 62 | 87, 81, 77, 0 |
| 41 | 5 | 1, 3, 9, 18, 63 | 29, 72, 83, 79, 0 |
| 42 | 4 | 0, 4, 24, 64 | 7, 27, 98, 0 |

TABLE 3-10-continued

| Row index | Row weight | Columns in which non-zero elements are located | Shift values of the non-zero elements |
|---|---|---|---|
| 43 | 5 | 1, 16, 18, 25, 65 | 119, 8, 139, 230, 0 |
| 44 | 5 | 0, 7, 9, 22, 66 | 249, 30, 162, 113, 0 |
| 45 | 4 | 1, 6, 10, 67 | 179, 132, 177, 0 |

In a design, the matrix 30b-20 in FIG. 3b-2A and FIG. 3b-2B may be represented by Table 3-20.

TABLE 3-20

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 182, 324, 183, 233, 325, 141, 232, 258, 71, 196, 242, 226, 224, 10, 222, 94, 59, 0, 0 |
| 1 | 19 | 0, 2, 3, 4, 5, 7, 8, 9, 11, 12, 14, 15, 16, 17, 19, 21, 22, 23, 24 | 171, 102, 348, 93, 315, 40, 86, 260, 81, 327, 229, 128, 269, 236, 138, 127, 1, 0, 0 |
| 2 | 19 | 0, 1, 2, 4, 5, 6, 7, 8, 9, 10, 13, 14, 15, 17, 18, 19, 20, 24, 25 | 17, 203, 0, 76, 0, 307, 74, 370, 0, 47, 21, 90, 0, 238, 51, 0, 253, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 117, 36, 0 |
| 5 | 8 | 0, 1, 3, 12, 16, 21, 22, 27 | 166, 168, 148, 307, 275, 112, 191, 0 |
| 6 | 9 | 0, 6, 10, 11, 13, 17, 18, 20, 28 | 123, 345, 235, 40, 217, 131, 314, 282, 0 |
| 7 | 7 | 0, 1,4, 7, 8, 14,29 | 262, 213, 115, 16, 41, 54, 0 |
| 8 | 10 | 0, 1, 3, 12, 16, 19, 21, 22, 24,30 | 134, 298, 163, 375, 13, 310, 161, 237, 201, 0 |
| 9 | 9 | 0, 1, 10, 11, 13, 17, 18, 20, 31 | 227, 162, 1, 110, 216, 320, 283, 262, 0 |
| 10 | 7 | 1, 2, 4, 7, 8, 14, 32 | 170, 152, 44, 301, 24, 214, 0 |
| 11 | 8 | 0, 1, 12, 16, 21, 22, 23, 33 | 73, 37, 328, 70, 127, 305, 345, 0 |
| 12 | 7 | 0, 1, 10, 11, 13, 18, 34 | 374, 99, 60, 30, 238, 210, 0 |
| 13 | 6 | 0, 3, 7, 20, 23, 35 | 185, 19, 256, 370, 106, 0 |
| 14 | 7 | 0, 12, 15, 16, 17, 21, 36 | 45, 15, 55, 73, 222, 311, 0 |
| 15 | 7 | 0, 1, 10, 13, 18, 25, 37 | 148, 335, 61, 366, 334, 39, 0 |
| 16 | 6 | 1, 3, 11, 20, 22, 38 | 138, 85, 167, 69, 110,0 |
| 17 | 6 | 0, 14, 16, 17, 21, 39 | 7, 371, 215, 6, 158, 0 |
| 18 | 6 | 1, 12, 13, 18, 19,40 | 351, 257, 342, 123, 169, 0 |
| 19 | 6 | 0, 1, 7, 8, 10,41 | 269, 13, 116, 43, 135, 0 |
| 20 | 6 | 0, 3, 9, 11, 22, 42 | 190, 307, 40, 39, 324, 0 |
| 21 | 6 | 1, 5, 16, 20, 21, 43 | 17, 264, 254, 145, 87, 0 |
| 22 | 5 | 0, 12, 13, 17,44 | 273, 325, 77, 189, 0 |
| 23 | 5 | 1, 2, 10, 18, 45 | 382, 102, 351, 2, 0 |
| 24 | 6 | 0, 3, 4, 11, 22, 46 | 232, 129, 216, 114, 348, 0 |
| 25 | 5 | 1, 6, 7, 14, 47 | 80, 90, 304, 107, 0 |
| 26 | 5 | 0, 2, 4, 15, 48 | 73, 271, 160, 38, 0 |
| 27 | 4 | 1, 6, 8, 49 | 209, 68, 32, 0 |
| 28 | 5 | 0, 4, 19, 21, 50 | 40, 236, 165, 225, 0 |
| 29 | 5 | 1, 14, 18, 25, 51 | 162, 376, 381, 327, 0 |
| 30 | 5 | 0, 10, 13, 24, 52 | 34, 351, 51, 43, 0 |
| 31 | 5 | 1, 7, 22, 25, 53 | 143, 288, 97, 298, 0 |
| 32 | 5 | 0, 12, 14, 24, 54 | 288, 257, 318, 62, 0 |
| 33 | 5 | 1, 2, 11, 21, 55 | 251, 179, 383, 337, 0 |
| 34 | 5 | 0, 7, 15, 17, 56 | 197, 127, 123, 252, 0 |
| 35 | 5 | 1, 6, 12, 22, 57 | 259, 345, 4, 232, 0 |
| 36 | 5 | 0, 14, 15, 18, 58 | 94, 101, 367, 228, 0 |
| 37 | 4 | 1, 13, 23, 59 | 1, 70, 242, 0 |
| 38 | 5 | 0, 9, 10, 12, 60 | 58, 358, 215, 218, 0 |
| 39 | 5 | 1, 3, 7, 19, 61 | 262, 11, 241, 42, 0 |
| 40 | 4 | 0, 8, 17,62 | 291, 211, 280, 0 |
| 41 | 5 | 1, 3, 9, 18,63 | 56, 321, 370, 115, 0 |
| 42 | 4 | 0, 4, 24, 64 | 41, 19, 32, 0 |
| 43 | 5 | 1, 16, 18, 25, 65 | 125, 133, 193, 178, 0 |
| 44 | 5 | 0, 7, 9, 22, 66 | 163, 74, 279, 18, 0 |
| 45 | 4 | 1, 6, 10, 67 | 46, 10, 98, 0 |

In a design, the matrix 30b-30 in FIG. 3b-3A and FIG. 3b-3B may be represented by Table 3-30.

TABLE 3-30

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 190, 13, 82, 205, 251, 214, 5, 217, 271, 3, 62, 249, 98, 128, 113, 224, 67, 0, 0 |

TABLE 3-30-continued

| Row index | Row weight | Columns in which non-zero elements are located | Shift values of the non-zero elements |
|---|---|---|---|
| 1 | 19 | 0, 2, 3, 4, 5, 7, 8, 9, 11, 12, 14, 15, 16, 17, 19, 21, 22, 23, 24 | 119, 12, 250, 216, 66, 114, 15, 8, 183, 189, 184, 157, 185, 188, 7, 106, 1, 0, 0 |
| 2 | 19 | 0, 1, 2, 4, 5, 6, 7, 8, 9, 10, 13, 14, 15, 17, 18, 19, 20, 24, 25 | 204, 303, 0, 297, 0, 113, 196, 225, 0, 42, 18, 51, 0, 134, 152, 0, 166, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 60, 32, 0 |
| 5 | 8 | 0, 1, 3, 12, 16, 21, 22, 27 | 86, 220, 210, 172, 271, 218, 79, 0 |
| 6 | 9 | 0, 6, 10, 11, 13, 17, 18, 20, 28 | 108, 247, 281, 13, 258, 146, 23, 255, 0 |
| 7 | 7 | 0, 1, 4, 7, 8, 14, 29 | 258, 308, 59, 283, 101, 95, 0 |
| 8 | 10 | 0, 1, 3, 12, 16, 19, 21, 22, 24, 30 | 63, 181, 236, 199, 190, 180, 288, 257, 135, 0 |
| 9 | 9 | 0, 1, 10, 11, 13, 17, 18, 20, 31 | 266, 74, 9, 239, 273, 10, 117, 118, 0 |
| 10 | 7 | 1, 2, 4, 7, 8, 14, 32 | 157, 210, 173, 301, 87, 299, 0 |
| 11 | 8 | 0, 1, 12, 16, 21, 22, 23, 33 | 111, 118, 174, 21, 293, 290, 294, 0 |
| 12 | 7 | 0, 1, 10, 11, 13, 18, 34 | 89, 242, 194, 196, 13, 183, 0 |
| 13 | 6 | 0, 3, 7, 20, 23, 35 | 78, 248, 171, 286, 176, 0 |
| 14 | 7 | 0, 12, 15, 16, 17, 21, 36 | 86, 275, 156, 119, 31, 267, 0 |
| 15 | 7 | 0, 1, 10, 13, 18, 25, 37 | 146, 48, 195, 84, 56, 294, 0 |
| 16 | 6 | 1, 3, 11, 20, 22, 38 | 214, 43, 215, 193, 259, 0 |
| 17 | 6 | 0, 14, 16, 17, 21, 39 | 153, 317, 172, 270, 307, 0 |
| 18 | 6 | 1, 12, 13, 18, 19, 40 | 294, 47, 264, 300, 202, 0 |
| 19 | 6 | 0, 1, 7, 8, 10,41 | 61, 237, 42, 252, 151, 0 |
| 20 | 6 | 0, 3, 9, 11, 22, 42 | 73, 114, 315, 149, 0, 0 |
| 21 | 6 | 1, 5, 16, 20, 21, 43 | 298, 122, 168, 216, 81, 0 |
| 22 | 5 | 0, 12, 13, 17, 44 | 282, 296, 127, 114, 0 |
| 23 | 5 | 1, 2, 10, 18, 45 | 128, 130, 169, 124, 0 |
| 24 | 6 | 0, 3, 4, 11, 22, 46 | 105, 77, 107, 211, 276, 0 |
| 25 | 5 | 1, 6, 7, 14, 47 | 107, 150, 58, 103, 0 |
| 26 | 5 | 0, 2, 4, 15, 48 | 254, 243, 10, 156, 0 |
| 27 | 4 | 1, 6, 8, 49 | 298, 62, 299, 0 |
| 28 | 5 | 0, 4, 19, 21, 50 | 168, 253, 12, 39, 0 |
| 29 | 5 | 1, 14, 18, 25, 51 | 250, 307, 89, 125, 0 |
| 30 | 5 | 0, 10, 13, 24, 52 | 264, 166, 247, 8, 0 |
| 31 | 5 | 1, 7, 22, 25, 53 | 173, 7, 1, 178, 0 |
| 32 | 5 | 0, 12, 14, 24, 54 | 288, 227, 209, 219, 0 |
| 33 | 5 | 1, 2, 11, 21, 55 | 313, 100, 228, 132, 0 |
| 34 | 5 | 0, 7, 15, 17, 56 | 3, 100, 156, 205, 0 |
| 35 | 5 | 1, 6, 12, 22, 57 | 207, 89, 91, 144, 0 |
| 36 | 5 | 0, 14, 15, 18, 58 | 255, 66, 158, 11, 0 |
| 37 | 4 | 1, 13, 23, 59 | 281, 184, 203, 0 |
| 38 | 5 | 0, 9, 10, 12, 60 | 180, 125, 136, 111, 0 |
| 39 | 5 | 1, 3, 7, 19, 61 | 233, 141, 309, 246, 0 |
| 40 | 4 | 0, 8, 17, 62 | 44, 199, 57, 0 |
| 41 | 5 | 1, 3, 9, 18, 63 | 191, 225, 159, 84, 0 |
| 42 | 4 | 0, 4, 24, 64 | 180, 98, 226, 0 |
| 43 | 5 | 1, 16, 18, 25, 65 | 318, 80, 29, 219, 0 |
| 44 | 5 | 0, 7, 9, 22, 66 | 253, 304, 266, 36, 0 |
| 45 | 4 | 1, 6, 10, 67 | 105, 10, 142, 0 |

In a design, the matrix 30b-40 in FIG. 3b-4A and FIG. 3b-4B may be represented by Table 3-40.

TABLE 3-40

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 189, 174, 162, 53, 32, 120, 143, 79, 7, 47, 188, 72, 5, 40, 141, 69, 67, 0, 0 |

TABLE 3-40-continued

| Row index | Row weight | Columns in which non-zero elements are located | Shift values of the non-zero elements |
|---|---|---|---|
| 1 | 19 | 0, 2, 3, 4, 5, 7, 8, 9, 11, 12, 14, 15, 16, 17, 19, 21, 22, 23, 24 | 36, 195, 130, 45, 133, 147, 98, 25, 205, 166, 60, 67, 52, 190, 127, 31, 1, 0, 0 |
| 2 | 19 | 0, 1, 2, 4, 5, 6, 7, 8, 9, 10, 13, 14, 15, 17, 18, 19, 20, 24, 25 | 118, 25, 0, 32, 0, 19, 55, 191, 0, 125, 2, 68, 0, 66, 44, 0, 179, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 71, 46, 0 |
| 5 | 8 | 0, 1, 3, 12, 16, 21, 22, 27 | 195, 182, 172, 37, 218, 118, 150, 0 |
| 6 | 9 | 0, 6, 10, 11, 13, 17, 18, 20, 28 | 81, 146, 121, 44, 170, 201, 185, 3, 0 |
| 7 | 7 | 0, 1, 4, 7, 8, 14, 29 | 85, 181, 144, 118, 12, 43, 0 |
| 8 | 10 | 0, 1, 3, 12, 16, 19, 21, 22, 24, 30 | 213, 91, 3, 28, 136, 5, 98, 148, 100, 0 |
| 9 | 9 | 0, 1, 10, 11, 13, 17, 18, 20, 31 | 208, 125, 112, 27, 190, 175, 130, 121, 0 |
| 10 | 7 | 1, 2, 4, 7, 8, 14, 32 | 128, 142, 80, 35, 214, 22, 0 |
| 11 | 8 | 0, 1, 12, 16, 21, 22, 23, 33 | 20, 153, 220, 29, 135, 159, 64, 0 |
| 12 | 7 | 0, 1, 10, 11, 13, 18, 34 | 194, 155, 103, 2, 205, 39, 0 |
| 13 | 6 | 0, 3, 7, 20, 23, 35 | 81, 52, 15, 219, 98, 0 |
| 14 | 7 | 0, 12, 15, 16, 17, 21, 36 | 153, 64, 167, 126, 63, 24, 0 |
| 15 | 7 | 0, 1, 10, 13, 18, 25, 37 | 133, 125, 134, 30, 10, 25, 0 |
| 16 | 6 | 1, 3, 11, 20, 22, 38 | 81, 169, 30, 42, 46, 0 |
| 17 | 6 | 0, 14, 16, 17, 21, 39 | 164, 89, 26, 126, 106, 0 |
| 18 | 6 | 1, 12, 13, 18, 19,40 | 56, 156, 155, 124, 174, 0 |
| 19 | 6 | 0, 1, 7, 8, 10, 41 | 196, 9, 209, 193, 116, 0 |
| 20 | 6 | 0, 3, 9, 11, 22, 42 | 62, 80, 162, 92, 37, 0 |
| 21 | 6 | 1, 5, 16, 20, 21, 43 | 215, 148, 142, 21, 22, 0 |
| 22 | 5 | 0, 12, 13, 17, 44 | 153, 40, 20, 128, 0 |
| 23 | 5 | 1,2, 10, 18, 45 | 35, 167, 64, 216, 0 |
| 24 | 6 | 0, 3, 4, 11, 22, 46 | 153, 138, 10, 67, 219, 0 |
| 25 | 5 | 1, 6, 7, 14, 47 | 147, 195, 89, 166, 0 |
| 26 | 5 | 0, 2, 4, 15, 48 | 219, 38, 97, 182, 0 |
| 27 | 4 | 1, 6, 8, 49 | 72, 152, 17, 0 |
| 28 | 5 | 0, 4, 19, 21, 50 | 0, 150, 221, 86, 0 |
| 29 | 5 | 1, 14, 18, 25, 51 | 61, 154, 119, 76,0 |
| 30 | 5 | 0, 10, 13, 24, 52 | 92, 30, 137, 42, 0 |
| 31 | 5 | 1, 7, 22, 25, 53 | 9, 25, 48, 111, 0 |
| 32 | 5 | 0, 12, 14, 24, 54 | 112, 64, 31, 15, 0 |
| 33 | 5 | 1, 2, 11, 21, 55 | 134, 91, 108, 149, 0 |
| 34 | 5 | 0, 7, 15, 17, 56 | 198, 201, 95, 153, 0 |
| 35 | 5 | 1, 6, 12, 22, 57 | 138, 30, 45, 192, 0 |
| 36 | 5 | 0, 14, 15, 18, 58 | 70, 193, 57, 204, 0 |
| 37 | 4 | 1, 13, 23, 59 | 81, 89, 26, 0 |
| 38 | 5 | 0, 9, 10, 12, 60 | 111, 85, 215, 145, 0 |
| 39 | 5 | 1, 3, 7, 19, 61 | 166, 135, 189, 213, 0 |
| 40 | 4 | 0, 8, 17, 62 | 112, 184, 17, 0 |
| 41 | 5 | 1, 3, 9, 18, 63 | 26, 35, 176, 62, 0 |
| 42 | 4 | 0, 4, 24, 64 | 134, 13, 146, 0 |
| 43 | 5 | 1, 16, 18, 25, 65 | 186, 116, 113, 166, 0 |
| 44 | 5 | 0, 7, 9, 22, 66 | 23, 33, 86, 192, 0 |
| 45 | 4 | 1, 6, 10, 67 | 7, 172, 186, 0 |

In a design, the matrix 30b-50 in FIG. 3b-5A and FIG. 3b-5B may be represented by Table 3-50.

TABLE 3-50

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 76, 207, 77, 49, 158, 285, 173, 219, 125, 78, 34, 142, 272, 62, 204, 223, 176, 0, 0 |
| 1 | 19 | 0, 2, 3, 4, 5, 7, 8, 9, 11, 12, 14, 15, 16, 17, 19, 21, 22, 23, 24 | 96, 237, 27, 65, 243, 97, 246, 2, 22, 226, 257, 141, 215, 231, 35, 254, 1, 0, 0 |
| 2 | 19 | 0, 1, 2, 4, 5, 6, 7, 8, 9, 10, 13, 14, 15, 17, 18, 19, 20, 24, 25 | 59, 68, 0, 109, 0, 57, 189, 269, 0, 92, 132, 69, 0, 170, 227, 0, 70, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 5, 128, 0 |
| 5 | 8 | 0, 1, 3, 12, 16, 21, 22, 27 | 1, 108, 93, 64, 45, 31, 200, 0 |
| 6 | 9 | 0, 6, 10, 11, 13, 17, 18, 20, 28 | 191, 136, 146, 242, 40, 125, 95, 253, 0 |
| 7 | 7 | 0, 1, 4, 7, 8, 14, 29 | 87, 253, 261, 2, 157, 274, 0 |
| 8 | 10 | 0, 1, 3, 12, 16, 19, 21, 22, 24, 30 | 236, 139, 36, 21, 156, 131, 287, 235, 169, 0 |
| 9 | 9 | 0, 1, 10, 11, 13, 17, 18, 20, 31 | 121, 230, 186, 159, 70, 61, 257, 173, 0 |
| 10 | 7 | 1, 2, 4, 7, 8, 14, 32 | 216, 45, 212, 260, 82, 166, 0 |
| 11 | 8 | 0, 1, 12, 16, 21, 22, 23, 33 | 42, 14, 35, 99, 15, 39, 287, 0 |
| 12 | 7 | 0, 1, 10, 11, 13, 18, 34 | 231, 225, 236, 149, 50, 179, 0 |
| 13 | 6 | 0, 3, 7, 20, 23, 35 | 265, 86, 277, 182, 138, 0 |
| 14 | 7 | 0, 12, 15, 16, 17, 21, 36 | 220, 259, 218, 198, 281, 117, 0 |
| 15 | 7 | 0, 1, 10, 13, 18, 25, 37 | 124, 188, 143, 146, 11, 6, 0 |
| 16 | 6 | 1, 3, 11, 20, 22, 38 | 195, 59, 208, 261, 230, 0 |
| 17 | 6 | 0, 14, 16, 17, 21, 39 | 134, 274, 35, 108, 122, 0 |
| 18 | 6 | 1, 12, 13, 18, 19, 40 | 273, 154, 96, 269, 83, 0 |
| 19 | 6 | 0, 1, 7, 8, 10, 41 | 234, 60, 107, 105, 121, 0 |
| 20 | 6 | 0, 3, 9, 11, 22, 42 | 194, 57, 241, 60, 196, 0 |
| 21 | 6 | 1, 5, 16, 20, 21, 43 | 70, 114, 108, 11, 208, 0 |
| 22 | 5 | 0, 12, 13, 17, 44 | 70, 172, 193, 45, 0 |
| 23 | 5 | 1, 2, 10, 18, 45 | 146, 84, 258, 97, 0 |
| 24 | 6 | 0, 3, 4, 11, 22, 46 | 201, 216, 212, 136, 78, 0 |
| 25 | 5 | 1, 6, 7, 14, 47 | 38, 50, 188, 267, 0 |
| 26 | 5 | 0, 2, 4, 15, 48 | 45, 113, 0, 242, 0 |
| 27 | 4 | 1, 6, 8, 49 | 213, 269, 172, 0 |
| 28 | 5 | 0, 4, 19, 21, 50 | 66, 160, 1, 266, 0 |
| 29 | 5 | 1, 14, 18, 25, 51 | 265, 39, 185, 86, 0 |
| 30 | 5 | 0, 10, 13, 24, 52 | 118, 186, 161, 34, 0 |
| 31 | 5 | 1, 7, 22, 25, 53 | 151, 140, 33, 18, 0 |
| 32 | 5 | 0, 12, 14, 24, 54 | 231, 201, 98, 269, 0 |
| 33 | 5 | 1, 2, 11, 21, 55 | 205, 259, 274, 129, 0 |
| 34 | 5 | 0, 7, 15, 17, 56 | 277, 231, 229, 164, 0 |
| 35 | 5 | 1, 6, 12, 22, 57 | 134, 7, 204, 27, 0 |
| 36 | 5 | 0, 14, 15, 18, 58 | 181, 168, 149, 12, 0 |
| 37 | 4 | 1, 13, 23, 59 | 280, 132, 101, 0 |
| 38 | 5 | 0, 9, 10, 12, 60 | 61, 227, 207, 56, 0 |
| 39 | 5 | 1, 3, 7, 19, 61 | 283, 172, 286, 228, 0 |
| 40 | 4 | 0, 8, 17, 62 | 11, 97, 243, 0 |
| 41 | 5 | 1, 3, 9, 18, 63 | 274, 216, 111, 65, 0 |
| 42 | 4 | 0, 4, 24, 64 | 156, 177, 171, 0 |
| 43 | 5 | 1, 16, 18, 25, 65 | 77, 282, 183, 110, 0 |
| 44 | 5 | 0, 7, 9, 22, 66 | 118, 169, 210, 69, 0 |
| 45 | 4 | 1, 6, 10, 67 | 178, 37, 15, 0 |

In a design, the matrix 30b-60 in FIG. 3b-6A and FIG. 3b-6B may be represented by Table 3-60.

TABLE 3-60

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 26, 118, 197, 59, 339, 9, 306, 280, 219, 149, 227, 321, 298, 62, 260, 55, 10, 0, 0 |
| 1 | 19 | 0, 2, 3, 4, 5, 7, 8, 9, 11, 12, 14, 15, 16, 17, 19, 21, 22, 23, 24 | 292, 33, 174, 25, 78, 21, 39, 50, 80, 233, 203, 90, 305, 316, 164, 70, 1, 0, 0 |

TABLE 3-60-continued

| Row index | Row weight | Columns in which non-zero elements are located | Shift values of the non-zero elements |
|---|---|---|---|
| 2 | 19 | 0, 1, 2, 4, 5, 6, 7, 8, 9, 10, 13, 14, 15, 17, 18, 19, 20, 24, 25 | 315, 270, 0, 194, 0, 261, 347, 53, 0, 32, 68, 224, 0, 267, 191, 0, 192, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 14, 30, 0 |
| 5 | 8 | 0, 1, 3, 12, 16, 21, 22, 27 | 197, 77, 129, 265, 230, 92, 207, 0 |
| 6 | 9 | 0, 6, 10, 11, 13, 17, 18, 20, 28 | 175, 192, 62, 156, 247, 161, 296, 110, 0 |
| 7 | 7 | 0, 1, 4, 7, 8, 14, 29 | 27, 130, 119, 18, 334, 147, 0 |
| 8 | 10 | 0, 1, 3, 12, 16, 19, 21, 22, 24, 30 | 102, 215, 126, 314, 305, 74, 238, 115, 189, 0 |
| 9 | 9 | 0, 1, 10, 11, 13, 17, 18, 20, 31 | 157, 232, 313, 136, 175, 304, 251, 14, 0 |
| 10 | 7 | 1, 2, 4, 7, 8, 14, 32 | 282, 148, 138, 344, 95, 27, 0 |
| 11 | 8 | 0, 1, 12, 16, 21, 22, 23, 33 | 158, 28, 7, 267, 253, 295, 311,0 |
| 12 | 7 | 0, 1, 10, 11, 13, 18, 34 | 350, 48, 351, 185, 278, 176, 0 |
| 13 | 6 | 0, 3, 7, 20, 23, 35 | 334, 30, 346, 168, 104, 0 |
| 14 | 7 | 0, 12, 15, 16, 17, 21, 36 | 164, 333, 57, 116, 117, 130, 0 |
| 15 | 7 | 0, 1, 10, 13, 18, 25, 37 | 312, 320, 217, 222, 201, 33, 0 |
| 16 | 6 | 1, 3, 11, 20, 22, 38 | 54, 67, 219, 332, 170, 0 |
| 17 | 6 | 0, 14, 16, 17, 21, 39 | 161, 331, 339, 194, 230, 0 |
| 18 | 6 | 1, 12, 13, 18, 19, 40 | 33, 123, 207, 172, 173, 0 |
| 19 | 6 | 0, 1, 7, 8, 10, 41 | 221, 62, 74, 37, 29, 0 |
| 20 | 6 | 0, 3, 9, 11, 22, 42 | 145, 139, 24, 0, 6, 0 |
| 21 | 6 | 1, 5, 16, 20, 21, 43 | 115, 258, 248, 215, 239, 0 |
| 22 | 5 | 0, 12, 13, 17, 44 | 242, 230, 165, 175, 0 |
| 23 | 5 | 1, 2, 10, 18, 45 | 63, 94, 241, 52, 0 |
| 24 | 6 | 0, 3, 4, 11, 22, 46 | 249, 142, 214, 58, 160, 0 |
| 25 | 5 | 1, 6, 7, 14, 47 | 244, 78, 53, 285, 0 |
| 26 | 5 | 0, 2, 4, 15, 48 | 34, 140, 178, 36, 0 |
| 27 | 4 | 1, 6, 8, 49 | 256, 50, 230, 0 |
| 28 | 5 | 0, 4, 19, 21, 50 | 107, 224, 147, 241, 0 |
| 29 | 5 | 1, 14, 18, 25, 51 | 277, 287, 194, 297, 0 |
| 30 | 5 | 0, 10, 13, 24, 52 | 22, 284, 134, 41, 0 |
| 31 | 5 | 1, 7, 22, 25, 53 | 343, 320, 48, 270, 0 |
| 32 | 5 | 0, 12, 14, 24, 54 | 337, 122, 245, 46, 0 |
| 33 | 5 | 1,2, 11, 21, 55 | 297, 157, 218, 43, 0 |
| 34 | 5 | 0, 7, 15, 17, 56 | 316, 11, 131, 135, 0 |
| 35 | 5 | 1, 6, 12, 22, 57 | 114, 319, 163, 328, 0 |
| 36 | 5 | 0, 14, 15, 18, 58 | 214, 88, 345, 142, 0 |
| 37 | 4 | 1, 13, 23, 59 | 277, 50, 220, 0 |
| 38 | 5 | 0, 9, 10, 12, 60 | 167, 312, 53, 43, 0 |
| 39 | 5 | 1, 3, 7, 19,61 | 190, 311, 63, 36, 0 |
| 40 | 4 | 0, 8, 17, 62 | 320, 189, 282, 0 |
| 41 | 5 | 1, 3, 9, 18, 63 | 127, 260, 344, 296, 0 |
| 42 | 4 | 0, 4, 24, 64 | 10, 148, 34, 0 |
| 43 | 5 | 1, 16, 18, 25, 65 | 112, 216, 104, 162, 0 |
| 44 | 5 | 0, 7, 9, 22, 66 | 91, 22, 257, 165, 0 |
| 45 | 4 | 1, 6, 10, 67 | 164, 14, 295, 0 |

In a design, the matrix **30*b*-70 in FIG. 3*b*-7A and FIG. 3*b*-7**B may be represented by Table 3-70.

TABLE 3-70

| Row index | Row weight | Columns in which non-zero elements are located | Shift values of the non-zero elements |
|---|---|---|---|
| 0 | 19 | 0, 1, 2, 3, 5, 6, 9, 10, 11, 12, 13, 15, 16, 18, 19, 20, 21, 22, 23 | 101, 37, 142, 86, 154, 107, 77, 19, 189, 114, 134, 167, 100, 200, 140, 191, 106, 0, 0 |
| 1 | 19 | 0, 2, 3, 4, 5, 7, 8, 9, 11, 12, 14, 15, 16, 17, 19, 21, 22, 23, 24 | 149, 111, 142, 92, 93, 155, 6, 44, 98, 125, 17, 86, 146, 195, 184, 135, 1, 0, 0 |
| 2 | 19 | 0, 1, 2, 4, 5, 6, 7, 8, 9, 10, 13, 14, 15, 17, 18, 19, 20, 24, 25 | 189, 179, 0, 79, 0, 8, 3, 61, 0, 28, 192, 89, 0, 82, 67, 0, 120, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |

TABLE 3-70-continued

| Row index | Row weight | Columns in which non-zero elements are located | Shift values of the non-zero elements |
|---|---|---|---|
| 4 | 3 | 0, 1, 26 | 67, 40, 0 |
| 5 | 8 | 0, 1, 3, 12, 16, 21, 22, 27 | 119, 168, 75, 20, 186, 35, 162, 0 |
| 6 | 9 | 0, 6, 10, 11, 13, 17, 18, 20, 28 | 92, 183, 110, 153, 122, 102, 51, 177, 0 |
| 7 | 7 | 0, 1, 4, 7, 8, 14, 29 | 107, 70, 144, 175, 62, 165, 0 |
| 8 | 10 | 0, 1, 3, 12, 16, 19, 21, 22, 24, 30 | 157, 160, 159, 197, 44, 141, 175, 34, 179, 0 |
| 9 | 9 | 0, 1, 10, 11, 13, 17, 18, 20, 31 | 66, 207, 8, 160, 13, 125, 135, 61, 0 |
| 10 | 7 | 1, 2, 4, 7, 8, 14, 32 | 21, 62, 161, 145, 181, 195, 0 |
| 11 | 8 | 0, 1, 12, 16, 21, 22, 23, 33 | 156, 46, 94, 48, 36, 122, 176, 0 |
| 12 | 7 | 0, 1, 10, 11, 13, 18, 34 | 189, 165, 91, 15, 1, 29, 0 |
| 13 | 6 | 0, 3, 7, 20, 23, 35 | 38, 157, 169, 181, 4, 0 |
| 14 | 7 | 0, 12, 15, 16, 17, 21, 36 | 73, 43, 194, 167, 32, 204, 0 |
| 15 | 7 | 0, 1, 10, 13, 18, 25, 37 | 39, 0, 178, 57, 11, 172, 0 |
| 16 | 6 | 1, 3, 11, 20, 22, 38 | 38, 65, 115, 164, 125, 0 |
| 17 | 6 | 0, 14, 16, 17, 21, 39 | 62, 207, 98, 31, 120, 0 |
| 18 | 6 | 1, 12, 13, 18, 19,40 | 170, 124, 25, 172, 70, 0 |
| 19 | 6 | 0, 1, 7, 8, 10,41 | 93, 181, 117, 110, 53, 0 |
| 20 | 6 | 0, 3, 9, 11, 22, 42 | 65, 144, 203, 37, 142, 0 |
| 21 | 6 | 1, 5, 16, 20, 21, 43 | 84, 156, 197, 152, 71, 0 |
| 22 | 5 | 0, 12, 13, 17, 44 | 3, 180, 5, 148, 0 |
| 23 | 5 | 1,2, 10, 18,45 | 120, 170, 4, 130, 0 |
| 24 | 6 | 0, 3,4, 11, 22, 46 | 180, 57, 133, 182, 165, 0 |
| 25 | 5 | 1, 6, 7, 14, 47 | 150, 190, 24, 143, 0 |
| 26 | 5 | 0, 2, 4, 15, 48 | 177, 86, 75, 200, 0 |
| 27 | 4 | 1, 6, 8, 49 | 184, 90, 111, 0 |
| 28 | 5 | 0, 4, 19, 21, 50 | 49, 10, 12, 37, 0 |
| 29 | 5 | 1, 14, 18, 25, 51 | 30, 117, 44, 157, 0 |
| 30 | 5 | 0, 10, 13, 24, 52 | 140, 65, 89, 8, 0 |
| 31 | 5 | 1, 7, 22, 25, 53 | 68, 169, 190, 24, 0 |
| 32 | 5 | 0, 12, 14, 24, 54 | 60, 127, 50, 55, 0 |
| 33 | 5 | 1,2, 11, 21, 55 | 187, 146, 78, 197,0 |
| 34 | 5 | 0, 7, 15, 17, 56 | 125, 184, 190, 85, 0 |
| 35 | 5 | 1, 6, 12, 22, 57 | 38, 129, 65, 76, 0 |
| 36 | 5 | 0, 14, 15, 18, 58 | 62, 183, 202, 206, 0 |
| 37 | 4 | 1, 13, 23, 59 | 154, 44, 59, 0 |
| 38 | 5 | 0, 9, 10, 12, 60 | 170, 175, 108, 0, 0 |
| 39 | 5 | 1, 3, 7, 19,61 | 20, 127, 38, 110, 0 |
| 40 | 4 | 0, 8, 17, 62 | 177, 41, 113, 0 |
| 41 | 5 | 1, 3, 9, 18, 63 | 188, 48, 205, 140, 0 |
| 42 | 4 | 0, 4, 24, 64 | 193, 182, 86, 0 |
| 43 | 5 | 1, 16, 18, 25, 65 | 142, 155, 140, 59, 0 |
| 44 | 5 | 0, 7, 9, 22, 66 | 172, 56, 138, 182, 0 |
| 45 | 4 | 1, 6, 10, 67 | 21, 12, 183, 0 |

In a design, the matrix 30b-80 in FIG. 3b-8A and FIG. 3b-8B may be represented by Table 3-80.

TABLE 3-80

| Row index | Row weight | Columns in which non-zero elements are located | Shift values of the non-zero elements |
|---|---|---|---|
| 0 | 19 | 0, 1,2, 3, 5, 6,9, 10, 11, 12, 13, 15, 16, 18, 19, 20, 21, 22, 23 | 189, 204, 133, 17, 181, 18, 7, 6, 237, 171, 65, 224, 8, 55, 93, 110, 212, 0, 0 |
| 1 | 19 | 0, 2, 3, 4, 5, 7, 8, 9, 11, 12, 14, 15, 16, 17, 19, 21, 22, 23, 24 | 113, 82, 29, 131, 83, 223, 34, 62, 130, 26, 33, 72, 135, 136, 156, 208, 1, 0, 0 |
| 2 | 19 | 0, 1, 2, 4, 5, 6, 7, 8, 9, 10, 13, 14, 15, 17, 18, 19, 20, 24, 25 | 95, 175, 0, 134, 0, 2, 19, 129, 0, 171, 174, 42, 0, 98, 6, 0, 22, 0, 0 |
| 3 | 19 | 0, 1, 3, 4, 6, 7, 8, 10, 11, 12, 13, 14, 16, 17, 18, 20, 21, 22, 25 | 0, 0, 0, 0, 0, 0, 0, 0, 0, 0, 0, 0, 0, 0, 0, 0, 0, 0, 0 |
| 4 | 3 | 0, 1, 26 | 83, 51, 0 |
| 5 | 8 | 0, 1, 3, 12, 16, 21, 22, 27 | 89, 210, 134, 51, 151, 67, 223, 0 |
| 6 | 9 | 0, 6, 10, 11, 13, 17, 18, 20, 28 | 199, 158, 37, 192, 184, 231, 47, 31, 0 |
| 7 | 7 | 0, 1, 4, 7, 8, 14, 29 | 152, 110, 79, 91, 195, 100, 0 |
| 8 | 10 | 0, 1, 3, 12, 16, 19, 21, 22, 24, | 4, 78, 104, 77, 165, 176, 6, 100, 30 79, 0 |

TABLE 3-80-continued

| Row index | Row weight | Columns in which non-zero elements are located | Shift values of the non-zero elements |
|---|---|---|---|
| 9 | 9 | 0, 1, 10, 11, 13, 17, 18, 20, 31 | 148, 155, 36, 99, 42, 71, 128, 86, 0 |
| 10 | 7 | 1, 2, 4, 7, 8, 14, 32 | 134, 146, 117, 96, 76, 162, 0 |
| 11 | 8 | 0, 1, 12, 16, 21, 22, 23, 33 | 187, 75, 22, 133, 147, 39, 195, 0 |
| 12 | 7 | 0, 1, 10, 11, 13, 18, 34 | 182, 234, 104, 112, 94, 69, 0 |
| 13 | 6 | 0, 3, 7, 20, 23, 35 | 53, 5, 206, 216, 147, 0 |
| 14 | 7 | 0, 12, 15, 16, 17, 21, 36 | 213, 21, 105, 86, 228, 102, 0 |
| 15 | 7 | 0, 1, 10, 13, 18, 25, 37 | 213, 166, 223, 127, 179, 56, 0 |
| 16 | 6 | 1, 3, 11, 20, 22, 38 | 47, 102, 184, 239, 20, 0 |
| 17 | 6 | 0, 14, 16, 17, 21, 39 | 98, 112, 78, 107, 93, 0 |
| 18 | 6 | 1, 12, 13, 18, 19,40 | 54, 14, 29, 126, 148, 0 |
| 19 | 6 | 0, 1, 7, 8, 10,41 | 53, 115, 153, 165, 210, 0 |
| 20 | 6 | 0, 3, 9, 11, 22, 42 | 225, 93, 65, 102, 100, 0 |
| 21 | 6 | 1, 5, 16, 20, 21, 43 | 220, 204, 178, 159, 37, 0 |
| 22 | 5 | 0, 12, 13, 17, 44 | 18, 234, 120, 113, 0 |
| 23 | 5 | 1,2, 10, 18, 45 | 160, 181, 29, 180, 0 |
| 24 | 6 | 0, 3, 4, 11, 22, 46 | 6, 94, 176, 238, 182, 0 |
| 25 | 5 | 1, 6, 7, 14, 47 | 66, 44, 207, 90, 0 |
| 26 | 5 | 0, 2, 4, 15, 48 | 86, 233, 30, 80, 0 |
| 27 | 4 | 1, 6, 8, 49 | 212, 209, 28, 0 |
| 28 | 5 | 0, 4, 19, 21, 50 | 87, 19, 53, 13, 0 |
| 29 | 5 | 1, 14, 18, 25, 51 | 185, 135, 143, 98, 0 |
| 30 | 5 | 0, 10, 13, 24, 52 | 151, 87, 232, 152, 0 |
| 31 | 5 | 1, 7, 22, 25, 53 | 95, 229, 17, 113, 0 |
| 32 | 5 | 0, 12, 14, 24, 54 | 111, 224, 115, 212, 0 |
| 33 | 5 | 1, 2, 11, 21, 55 | 182, 61, 204, 172, 0 |
| 34 | 5 | 0, 7, 15, 17, 56 | 230, 137, 19, 234, 0 |
| 35 | 5 | 1, 6, 12, 22, 57 | 37, 125, 112, 126, 0 |
| 36 | 5 | 0, 14, 15, 18, 58 | 109, 72, 239, 39, 0 |
| 37 | 4 | 1, 13, 23, 59 | 154, 132, 119, 0 |
| 38 | 5 | 0, 9, 10, 12, 60 | 112, 158, 194, 203, 0 |
| 39 | 5 | 1, 3, 7, 19, 61 | 224, 140, 0, 68, 0 |
| 40 | 4 | 0, 8, 17, 62 | 8, 179, 78, 0 |
| 41 | 5 | 1, 3, 9, 18, 63 | 120, 71, 171, 178, 0 |
| 42 | 4 | 0, 4, 24, 64 | 39, 10, 192, 0 |
| 43 | 5 | 1, 16, 18, 25, 65 | 169, 211, 209, 184, 0 |
| 44 | 5 | 0, 7, 9, 22, 66 | 227, 12, 68, 74, 0 |
| 45 | 4 | 1, 6, 10, 67 | 91, 0, 204, 0 |

It may be understood that, FIG. 1 to FIG. 3a-1 and FIG. 3a-2, FIG. 3b-1A to FIG. 3b-8B, and Table 2-10, Table 2-11, and Table 3-10 to Table 3-80 are intended to help understand designs of the base graph and the matrix, and representation forms of the designs are not limited to representation forms of FIG. 1 to FIG. 3a-1 and FIG. 3a-2 and FIG. 3b-1A to FIG. 3b-8B, or Table 2-10, Table 2-11, and Table 3-10 to Table 3-80. Another possible variation may further be included.

In one embodiment, the parameter "row weight" in Table 2-10, Table 2-11, and Table 3-10 to Table 3-80 may alternatively be omitted. A quantity of non-zero elements in a row may be learned from columns in which the non-zero elements in the row are located, and therefore, a row weight is learned.

In one embodiment, parameter values in "columns in which non-zero elements are located" in Table 2-10, Table 2-11, and Table 3-10 to Table 3-80 may not be arranged in ascending order, provided that the parameter values are indexed to the columns in which the non-zero elements are located. In addition, parameter values in "shift values of the non-zero elements" in Table 2-10, Table 2-11, and Table 3-10 to Table 3-80 are not necessarily arranged in a column sequence either, provided that the parameter values in "shift values of the non-zero elements" are in a one-to-one correspondence with the parameter values in "columns in which non-zero elements are located".

Figure 5:
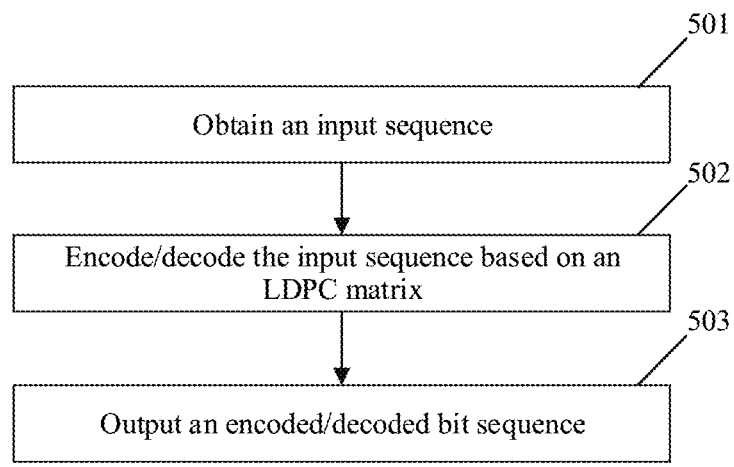

FIG. 5 shows a design of a data processing process. The data processing process may be implemented by a communications apparatus. The communications apparatus may be a base station, a terminal, another entity, or the like, for example, a communications chip or an encoder/decoder.

Part 501: Obtain an input sequence.

In one embodiment, a to-be-encoded input sequence may be an information bit sequence. The information bit sequence is also referred to as a code block (code block) sometimes, for example, may be an output sequence obtained after performing code block division on a transport block. In one embodiment, a to-be-decoded input sequence may be a soft value sequence of an LDPC code.

Part 502: Encode/decode the input sequence based on an LDPC matrix, where a base matrix of the LDPC matrix may be any base matrix in the foregoing examples.

In one embodiment, the LDPC matrix may be obtained based on a lifting factor Z and the base matrix.

In one embodiment, related parameters of the LDPC matrix may be saved, and these parameters include one or more of the following:

(a) parameters used to obtain any base matrix listed in the foregoing embodiments. The base matrix may be obtained based on the parameters. For example, the parameters may include one or more of the following: a row index, a row weight, a position of a non-zero element, a shift value in the base matrix, a shift value of the non-zero element and a corresponding position, an offset, a lifting factor, a base graph, a code rate, and the like.

(b) any base matrix listed in the foregoing embodiments;

(c) a compensation matrix Hs obtained by compensating at least one column in any base matrix listed in the foregoing embodiments;

(d) a matrix obtained by lifting a base matrix or a compensation matrix Hs of the base matrix;

(e) a base matrix obtained by performing a row/column transform on any base matrix listed in the foregoing embodiments or the compensation matrix Hs.

(f) a matrix obtained by lifting the base matrix or the compensation matrix Hs obtained through the row/column transform;

(g) a base matrix obtained by shortening or puncturing any base matrix listed in the foregoing embodiments or the compensation matrix Hs.

In one embodiment, the encoding/decoding the input sequence based on the low density parity check LDPC matrix may be performed in one or more of the following manners in an encoding/decoding process:

i. obtaining a base matrix based on (a), and encoding/decoding based on the obtained base matrix; or performing row/column switching based on the obtained base matrix, and encoding/decoding based on a row/column-transformed base matrix; or encoding/decoding based on a compensation matrix of the obtained base matrix; or encoding/decoding based on a matrix obtained by performing a row/column transform on a compensation matrix Hs of the obtained base matrix. In one embodiment, the encoding/decoding based on the base matrix or the compensation matrix Hs herein may alternatively include encoding/decoding based on a lifting matrix of the base matrix or a lifting matrix of the compensation matrix Hs, or encoding/decoding based on a matrix obtained by shortening or puncturing the base matrix or the compensation matrix;

ii. encoding/decoding based on the base matrix (the saved base matrix H or Hs, or a saved base matrix obtained by performing the row/column transform on the base matrix H or Hs) saved in (b), (c), (d), or (e), or performing a row/column transform on the saved base matrix, and encoding/decoding based on a row/column transformed base matrix. In one embodiment, the encoding/decoding based on the base matrix or the compensation matrix Hs herein may alternatively include encoding/decoding based on a lifting matrix of the base matrix or a lifting matrix of the compensation matrix Hs, or encoding/decoding based on a matrix obtained by shortening or puncturing the base matrix or the compensation matrix; and iii. encoding/decoding based on (d), (f) or (g).

Part 503: Output an encoded/decoded bit sequence.

Figure 6:
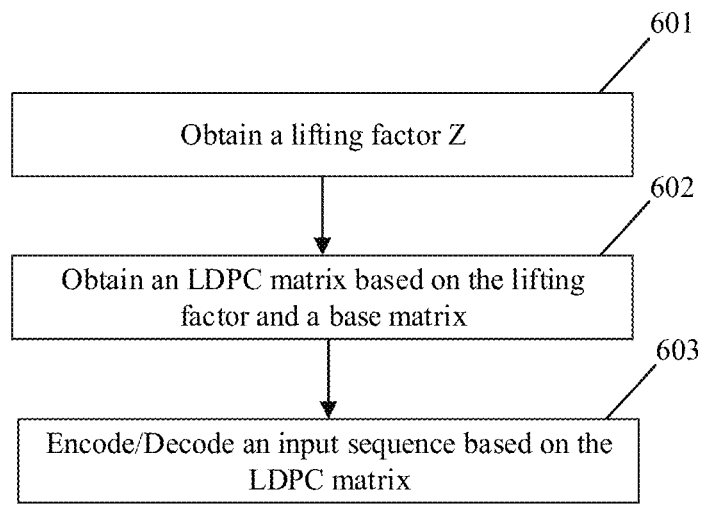

FIG. 6 shows a design of a processed data obtaining process, and the design may be applied to part 502 in FIG. 5.

Part 601: Obtain a lifting factor Z.

In one embodiment, the lifting factor Z may be determined based on a length K of an input sequence. For example, in a supported lifting factor set, a minimum $Z_0$ may be found and used as a value of the lifting factor Z, and $Kb \cdot Z_0 \geq K$. In one embodiment, Kb may represent a quantity of information bit columns in a base matrix of an LDPC code. In a base graph 30a, a quantity $Kb_{max}$ of information bit columns is equal to 22. It is assumed that a lifting factor set supported by the base graph 30a is {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}.

If the length K of the input sequence is 529 bits, Z is 26. If the length K of the input sequence is 5000 bits, Z is 240. It should be noted that, this is merely an example, and the present application is not limited thereto.

For another example, a value of Kb may also vary with a value of K, and does not exceed the quantity of information bit columns in the base matrix of the LDPC code. For example, when K is greater than a first threshold, Kb=22; or when K is less than or equal to a first threshold, Kb=21. Alternatively, when K is greater than a first threshold, Kb=22; when K is less than or equal to a first threshold, and K is greater than a second threshold, Kb=21; or when K is less than or equal to a second threshold, Kb=20. It should be noted that, this is merely an example for description, and the present application is not limited thereto.

In addition, based on any one of the foregoing embodiments, for a particular information length K, for example, when 104≤K≤512, Z may alternatively be selected according to a rule defined in a system. For another length, K is still selected according to any one of the foregoing embodiments, for example, the minimum $Z_0$ is selected, where $Kb \cdot Z_0 \geq K$ is met. The value of Kb is 22 or is determined based on a threshold.

In a design, when 104≤K≤512, Z is selected as shown in Table 4-1, and another length is selected according to any one of the foregoing embodiments.

TABLE 4-1

| Value range of K | Lifting factor Z |
| --- | --- |
| 104 to 119 | 6 |
| 120 to 127 | 8 |
| 128 to 135 | 6 |
| 136 to 183 | 8 |
| 184 to 199 | 10 |
| 200 to 271 | 12 |
| 272 to 279 | 16 |
| 280 to 287 | 13 |
| 288 to 303 | 16 |
| 304 to 311 | 18 |
| 312 to 327 | 16 |
| 328 to 335 | 20 |
| 336 to 375 | 18 |
| 376 to 383 | 20 |
| 384 to 399 | 18 |
| 400 to 415 | 20 |
| 416 to 431 | 22 |
| 432 to 447 | 20 |
| 448 to 463 | 22 |
| 464 to 479 | 24 |
| 480 to 487 | 28 |
| 488 to 503 | 26 |
| 504 to 511 | 24 |

The lifting factor Z may be determined by a communications apparatus based on the length K of the input sequence, or may be obtained by a communications apparatus from another entity (for example, a processor).

Part 602: Obtain an LDPC matrix based on the lifting factor and a base matrix.

The base matrix is any base matrix listed in the foregoing embodiments, or a compensation matrix obtained by compensating at least one column in any base matrix listed above, or a base matrix in which a row sequence is changed, a column sequence is changed, or both a row sequence and a column sequence are changed compared with any base matrix listed above or a compensation matrix. The base graph of the base matrix includes at least a submatrix A and a submatrix B. In one embodiment, a submatrix C, a submatrix D, and a submatrix E may further be included. For each submatrix, refer to the descriptions in the foregoing embodiments. Details are not described herein.

In one embodiment, a corresponding base matrix is determined based on the lifting factor Z, and the base matrix is permuted based on the lifting factor Z to obtain the LDPC matrix.

In one embodiment, a correspondence between a lifting factor and a base matrix may be stored, and a corresponding base matrix is determined based on the lifting factor Z obtained in part 601.

For example, Z is 26, and a=13. The base matrix may include a row 0 to a row 4 and a column 0 to a column 26 in the matrix 30b-7, or the base matrix includes a row 0 to a row 4 and some of a column 0 to a column 26 in the matrix 30b-7. Further, the base matrix further includes the row 0 to a row (m−1) and the column 0 to a column (n−1) in the matrix, where 5≤m≤46, m is an integer, 27≤n≤68, n is an integer; or the base matrix includes the row 0 to a row (m−1) and the column 0 to a column (n−1) in the matrix 30b-7, where 5≤m≤46, m is an integer, 27≤n≤68, n is an integer. The base matrix is permuted based on the lifting factor Z, to obtain the LDPC matrix.

It should be noted that, Z=26, a=13, and the matrix shown in FIG. 3b-7A and FIG. 3b-7B are merely used as an example for description herein, and the present application is not limited thereto. It may be understood that different lifting factors indicate different base matrices.

In one embodiment, a correspondence between a lifting factor and a base matrix may be shown in Table 5, and a base matrix index corresponding to the lifting factor is determined according to Table 5. In one embodiment, a PCM1 may be the matrix 30b-10 shown in FIG. 3b-1A and FIG. 3b-1B, a PCM2 may be the matrix 30b-20 shown in FIG. 3b-2A and FIG. 3b-2B, a PCM3 may be the matrix 30b-30 shown in FIG. 3b-3A and FIG. 3b-3B, a PCM4 may be the matrix 30b-40 shown in FIG. 3b-4A and FIG. 3b-4B, a PCM5 may be the matrix 30b-50 shown in FIG. 3b-5A and FIG. 3b-5B, a PCM6 may be the matrix 30b-60 shown in FIG. 3b-6A and FIG. 3b-6B, a PCM7 may be the matrix 30b-70 shown in FIG. 3b-7A and FIG. 3b-7B, and a PCM8 may be the matrix 30b-80 shown in FIG. 3b-8A and FIG. 3b-8B. This is merely an example herein, and the present application is not limited thereto.

TABLE 5

| Base matrix index | Lifting factor Z | | | | | | | |
|---|---|---|---|---|---|---|---|---|
| PCM1 | 2 | 4 | 8 | 16 | 32 | 64 | 128 | 256 |
| PCM2 | 3 | 6 | 12 | 24 | 48 | 96 | 192 | 384 |
| PCM3 | 5 | 10 | 20 | 40 | 80 | 160 | 320 | |
| PCM4 | 7 | 14 | 28 | 56 | 112 | 224 | | |
| PCM5 | 9 | 18 | 36 | 72 | 144 | 288 | | |
| PCM6 | 11 | 22 | 44 | 88 | 176 | 352 | | |
| PCM7 | 13 | 26 | 52 | 104 | 208 | | | |
| PCM8 | 15 | 30 | 60 | 120 | 240 | | | |

Further, in one embodiment, for the lifting factor Z, an element $P_{i,j}$ in a row i and a column j in the base matrix corresponding to the lifting factor Z may meet the following relationship:

$$P_{i,j} = \begin{cases} -1 & V_{i,j} = -1 \\ \mod(V_{i,j}, Z) & V_{i,j} \geq 0 \end{cases},$$

$V_{i,j}$ may represent a shift value of an element in a row i and a column j in a base matrix corresponding to a set to which the lifting factor Z belongs, or a shift value of a non-zero element in a row i and a column j in a base matrix corresponding to a largest lifting factor in a set to which the lifting factor Z belongs.

For example, using that Z is 13 as an example, an element $P_{i,j}$ in a row i and a column j in a base matrix of the LDPC matrix meets:

$$P_{i,j} = \begin{cases} -1 & V_{i,j} = -1 \\ \mod(V_{i,j}, Z) & V_{i,j} \geq 0 \end{cases},$$

where $V_{i,j}$ represents the PCM7, and in one embodiment, a shift value of a non-zero element in a row i and a column j in the matrix 30b-70. When Z=13, a modulo operation needs to be performed, by using Z=13, on the shift value $V_{i,j}$ of the non-zero element in the row i and the column j in the matrix 30b-70.

It should be noted that, this is merely an example, and the present application is not limited thereto.

Part 603: Encode/decode the input sequence based on the LDPC matrix.

In one embodiment, a to-be-encoded input sequence may be an information bit sequence. In one embodiment, a to-be-decoded input sequence may be a soft value sequence of the LDPC code. For details, refer to the related descriptions in FIG. 5.

When the input sequence is encoded/decoded, an LDPC matrix H may be obtained by lifting the base matrix based on Z. For each non-zero element $P_{i,j}$ in the base matrix, a Z×Z circulant permutation matrix $h_{i,j}$ is determined. $h_{i,j}$ represents a circulant permutation matrix obtained by performing a cyclic shift on an identity matrix for $P_{i,j}$ times. The non-zero element is replaced with $h_{i,j}$ and a zero element in a base matrix $H_B$ is replaced with a Z×Z all-zero matrix, to obtain a parity check matrix H.

In one embodiment, the base matrix of the LDPC code may be saved in a memory, and the communications apparatus obtains the LDPC matrix corresponding to the lifting factor Z, to encode/decode the input sequence.

In one embodiment, because there are a plurality of base matrices of the LDPC code, relatively large storage space is occupied if the base matrices are saved based on a matrix structure. The base graph of the LDPC code may alternatively be saved in a memory, and shift values of non-zero elements in each base matrix may be saved by row or by column, and then an LDPC matrix is obtained based on the base graph and a shift value of the base matrix corresponding to the lifting factor Z.

In one embodiment, shift values of non-zero elements in each base matrix may alternatively be saved in forms of Table 2-10, Table 2-11, and Table 3-10 to Table 3-80, and are used as parameters of the LDPC matrix. The column "Row weight" in Table 2-10, Table 2-11, and Table 3-10 to Table 3-80 is optional. In other words, the column "Row weight" may be optionally saved or may not be saved. A quantity of non-zero elements in a row may be learned from columns in which the non-zero elements in the row are located, and therefore, a row weight is learned. In one embodiment, parameter values in "columns in which non-zero elements are located" in Table 2-10, Table 2-11, and Table 3-10 to Table 3-80 may not be arranged in ascending order, provided that the parameter values are indexed to the columns in which the non-zero elements are located. In addition, parameter values in "shift values of the non-zero elements" in Table 2-10, Table 2-11, and Table 3-10 to Table 3-80 are not necessarily arranged in a column sequence either, provided that the parameter values in "shift values of the non-zero elements" are in a one-to-one correspondence with the parameter values in "columns in which non-zero elements are located". The communications apparatus may learn a row and a column that are corresponding to a shift value of a non-zero element.

In one embodiment, related parameters of the LDPC matrix may be saved with reference to the related descriptions in FIG. 5.

In one embodiment, when the related parameters of the LDPC matrix are saved, all rows in the matrices shown in FIG. 1 to FIG. 3a-1 and FIG. 3a-2 and FIG. 3b-1A to FIG. 3b-8B, or Table 2-10, Table 2-11, and Table 3-10 to Table 3-80 may not be saved, and parameters indicated by corresponding rows in the tables may be saved based on rows included in the base matrix. For example, a matrix formed by rows and columns included in the base matrix of the LDPC matrix described in the foregoing embodiment, or related parameters of the matrix formed by rows and columns may be saved.

For example, if the base matrix includes a row 0 to a row 4 and a column 0 to a column 26 in any one of matrices 30b-10 to 30b-80, a matrix formed by the row 0 to the row 4 and the column 0 to the column 26 may be saved, and/or related parameters of a matrix formed by the row 0 to the row 4 and the column 0 to the column 26 may be saved. For details, refer to the parameters shown in Table 3-10 to Table 3-80 and the foregoing descriptions.

If the base matrix includes a row 0 to a row (m−1) and a column 0 to a column (n−1) in any one of matrices 30b-10 to 30b-80, a matrix formed by the row 0 to the row (m−1) and the column 0 to the column (n−1) may be saved, and/or related parameters of a matrix formed by the row 0 to the row (m−1) and the column 0 to the column (n−1) may be saved, where 5≤m≤46, m is an integer, 27≤n≤68, and n is an integer. For details, refer to the parameters shown in Table 3-10 to Table 3-80 and the foregoing descriptions.

In one embodiment, each shift value that is greater than or equal to 0 and that is indicated by a position s in at least one of "columns in which non-zero elements are located" in any one of Table 3-10 to Table 3-80 may be increased or decreased by an offset $Offset_s$.

It should be noted that, this is merely an example, and the present application is not limited thereto.

Using FIG. 1 as an example, after the base matrix $H_B$ is determined, parity bits corresponding to a row 22 to a row 25 may be obtained first by using the input sequence and a row 0 to a row 3 and a column 0 to a column 25 in the base matrix, that is, $H_{core-dual}$. Then, a column 26 is obtained based on the input sequence and the parity bits corresponding to $H_{core-dual}$, that is, parity bits corresponding to a column having a column weight of 1. Next, parity bits corresponding to the submatrix E are obtained based on the input sequence and the parity bits corresponding to the column 22 to the column 26 and after parity bits corresponding to the submatrix D are encoded, to complete encoding. For an encoding process of the LDPC code, refer to the descriptions in the foregoing embodiments. Details are not described herein.

In one embodiment, in a communications system, an LDPC code may be obtained after encoding by using the foregoing method. After the LDPC code is obtained, the communications apparatus may further perform one or more of the following operations: performing rate matching on the LDPC code; performing interleaving on the rate-matched LDPC code based on an interleaving scheme; modulating the interleaved LDPC code based on a modulation scheme, to obtain a bit sequence X; and sending the bit sequence X.

Decoding is an inverse process of encoding, and a base matrix used in a decoding process has a same characteristic as a base matrix used in an encoding process. For the encoding process of the LDPC code, refer to the descriptions in the foregoing embodiments. Details are not described herein. In one embodiment, before the decoding, the communications apparatus may further perform one or more of the following operations: receiving a signal obtained through LDPC encoding; performing demodulation, deinterleaving, and de-rate matching on the signal to obtain a soft value sequence of the LDPC code; and decoding the soft value sequence of the LDPC code.

"Save" in this application may be saving the parameters in one or more memories. The one or more memories may be separately disposed, or may be integrated into an encoder or a decoder, a processor, a chip, a communications apparatus, or a terminal. Alternatively, some of the one or more memories may be separately disposed, and the others may be integrated into a decoder, a processor, a chip, a communications apparatus, or a terminal. A type of the memory may be any form of storage medium. This is not limited in this application.

Figure 7:
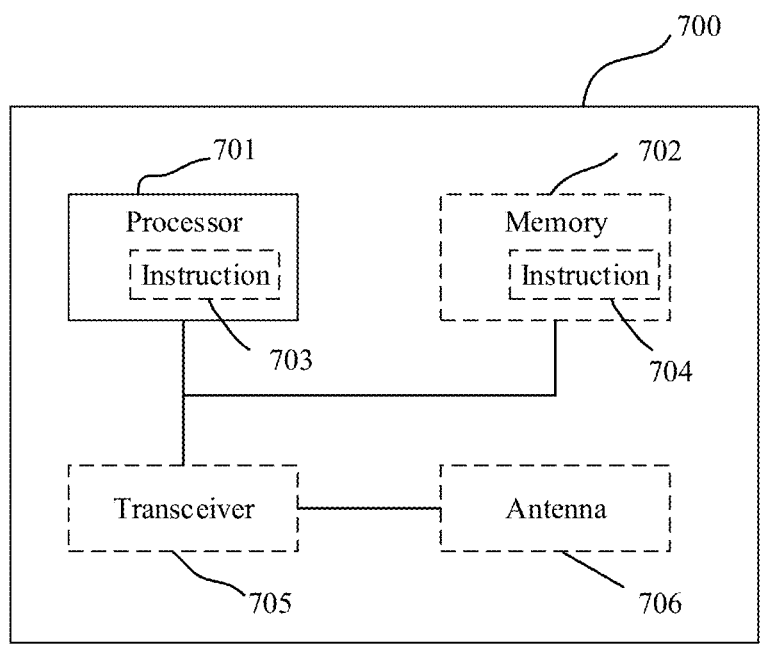

Corresponding to the design of the data processing process shown in FIG. 5 or FIG. 6, an embodiment of the present application further provides a corresponding communications apparatus. The communications apparatus includes a corresponding module configured to perform each part in FIG. 5 or FIG. 6. The module may be software, hardware, or a combination of software and hardware. For example, the module may include a memory, an electronic device, an electronic component, a logic circuit, or any combination thereof. FIG. 7 is a schematic structural diagram of a communications apparatus 700. The apparatus 700 may be configured to implement the methods described in the foregoing method embodiments. For details, refer to the descriptions in the foregoing method embodiments. The communications apparatus 700 may be a chip, a base station, a terminal, or another network device.

The communications apparatus 700 includes one or more processors 701. The processor 701 may be a general-purpose processor, a special-purpose processor, or the like. For example, the processor 701 may be a baseband processor or a central processing unit. The baseband processor may be configured to process a communication protocol and communications data. The central processing unit may be configured to: control the communications apparatus (such as the base station, the terminal, or the chip), execute a software program, and process data of the software program.

In one embodiment, one or more modules in FIG. 7 may be implemented by one or more processors, or may be implemented by one or more processors and memories.

In one embodiment, the communications apparatus 700 includes the one or more processors 701, and the one or more processors 701 may implement the foregoing encoding/decoding function. For example, the communications apparatus may be an encoder or a decoder. In one embodiment, in addition to a encoding/decoding function, the processor 701 may implement another function.

The communications apparatus 700 encodes/decodes an input sequence based on an LDPC matrix. A base matrix of the LDPC matrix may be any base matrix in the foregoing examples, or a base matrix obtained by transforming a row sequence, or a column sequence, or both a row sequence and a column sequence relative to any base matrix listed above, or a base matrix obtained by shortening or puncturing any base matrix listed above, or a matrix obtained by lifting any base matrix listed above. For encoding or decoding processing, refer to the related descriptions in FIG. 5 and FIG. 6. Details are not described herein again.

In one embodiment, in a design, the processor 701 may include an instruction 703 (sometimes also referred to as code or a program). The instruction may be run on the processor, so that the communications apparatus 700 performs the methods described in the foregoing embodiments. In one embodiment, the communications apparatus 700 may further include a circuit, and the circuit may implement the encoding/decoding function in the foregoing method embodiments.

In one embodiment, in a design, the communications apparatus 700 may include one or more memories 702. The one or more memories 702 store an instruction 704. The instruction may be run on the processor, so that the communications apparatus 700 performs the methods described in the foregoing method embodiments.

In one embodiment, the memory may further store data. In one embodiment, the processor may also store an instruction and/or data. The processor and the memory may be separately disposed, or may be integrated together.

In one embodiment, "save" in the foregoing embodiment may be saving in the memory 702, or may be saving in another peripheral memory or storage device.

For example, the one or more memories 702 may store a parameter related to the LDPC matrix listed above, for example, a parameter related to a base matrix, such as a shift value, a base graph, a matrix obtained by lifting the base graph, a row in the base matrix, a lifting factor, the base matrix, and a matrix obtained by lifting the base matrix. For details, refer to the related descriptions in FIG. 5.

In one embodiment, the communications apparatus 700 may further include a transceiver 705 and an antenna 706. The processor 701 may be referred to as a processing unit, and controls the communications apparatus (the terminal or the base station). The transceiver 505 may be referred to as a transceiver unit, a transceiver, a transceiver circuit, a transceiver, or the like, and is configured to implement a transceiver function of the communications apparatus by using the antenna 506.

In one embodiment, the communications apparatus 700 may further include a device configured to generate a transport block CRC, a device configured to perform code block segmentation and a CRC check, an interleaver configured to perform interleaving, a device configured to perform rate matching, a modulator configured to perform modulation processing, or the like. Functions of these devices may be implemented by the one or more processors 701.

In one embodiment, the communications apparatus 700 may further include a demodulator configured to perform a demodulation operation, a deinterleaver configured to perform de-interleaving, a component configured to perform de-rate matching, a device configured to perform code block concatenation and a CRC check, or the like. Functions of these devices may be implemented by the one or more processors 701.

Figure 8:
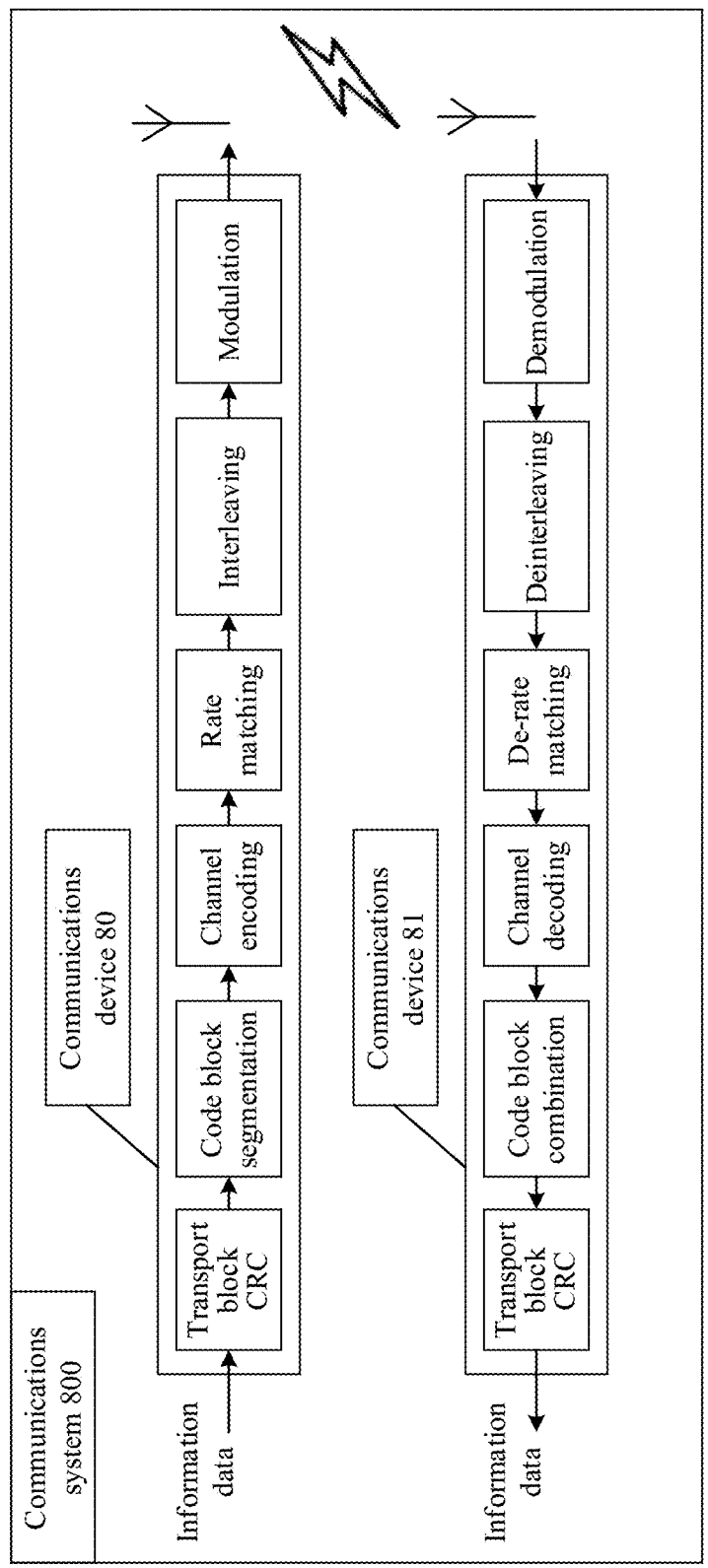

FIG. 8 is a schematic diagram of a communications system 800. The communications system 800 includes a communications device 80 and a communications device 81. Information data is received and sent between the communications device 80 and the communications device 81. The communications device 80 and the communications device 81 may be the communications apparatus 700, or the communications device 80 and the communications device 81 each include the communications apparatus 700, and receive and send the information data. For example, the communications device 80 may be a terminal, and correspondingly, the communications device 81 may be a base station. For another example, the communications device 80 is a base station, and correspondingly, the communications device 81 may be a terminal.

A person skilled in the art may further understand that various illustrative logical blocks (illustrative logical block) and operations (operation) that are listed in the embodiments of the present application may be implemented by using electronic hardware, computer software, or a combination thereof. Whether the functions are implemented by using hardware or software depends on particular applications and a design requirement of the entire system. A person skilled in the art may use various methods to implement the described functions for each particular application, but it should not be considered that the implementation goes beyond the scope of the embodiments of the present application.

The technologies described in this application may be implemented in various manners. For example, these technologies may be implemented by using hardware, software, or a combination of hardware and software. During hardware implementation, a processing unit configured to execute these technologies at a communications apparatus (such as a base station, a terminal, a network entity, or a chip) may be implemented in one or more general-purpose processors, a digital signal processor (DSP), a digital signal processing device (DSPD), an application-specific integrated circuit (ASIC), a programmable logic device (PLD), a field-programmable gate array (FPGA), or another programmable logic apparatus, discrete gate, or transistor logic, a discrete hardware component, or any combination thereof. The general-purpose processor may be a microprocessor. In one embodiment, the general-purpose processor may alternatively be any conventional processor, controller, microcontroller, or state machine. The processor may also be implemented by a combination of computing apparatuses, such as a digital signal processor and a microprocessor, a plurality of microprocessors, one or more microprocessors with a digital signal processor core, or any other similar configuration.

Operations of the methods or algorithms described in the embodiments of the present application may be directly embedded into hardware, an instruction executed by a processor, or a combination thereof. The memory may be a RAM memory, a flash memory, a ROM memory, an EPROM memory, an EEPROM memory, a register, a hard disk, a removable magnetic disk, a CD-ROM, or a storage medium of any other form in the art. For example, the memory may be connected to a processor, so that the processor may read information from the memory and write information into the memory. In one embodiment, the memory may alternatively be integrated into a processor. The processor and the memory may be disposed in an ASIC, and the ASIC may be disposed in UE. In one embodiment, the processor and the memory may alternatively be disposed in different components of the UE.

With descriptions of the foregoing embodiments, a person skilled in the art may clearly understand that the present application may be implemented by hardware, firmware or a combination thereof. When a software program is used to implement the embodiments, the embodiments may be implemented completely or partially in a form of a computer program product. The computer program product includes one or more computer instructions. When the computer instruction is loaded and executed on the computer, the procedures or functions according to the embodiments of the present application are all or partially generated. When the present application is implemented by using a software program, the foregoing functions may be stored in a computer-readable medium or transmitted as one or more instructions or code in the computer-readable medium. The computer may be a general-purpose computer, a special-purpose computer, a computer network, or another programmable apparatus. The computer instruction may be stored in a computer-readable storage medium or may be transmitted from a computer-readable storage medium to another computer-readable storage medium. The computer-readable medium includes a computer storage medium and a communications medium. The communications medium includes any medium that enables a computer program to be transmitted from one place to another. The storage medium may be any available medium accessible to a computer. The following provides an example but does not impose any limitation: The computer-readable medium may include a RAM, a ROM, an EEPROM, a CD-ROM, or another optical disc storage, a magnetic disk storage medium, or another magnetic storage device, or any other medium that can carry or store expected program code in a form of an instruction or a data structure and is accessible to a computer. In addition, any connection may be appropriately defined as a computer-readable medium. For example, if software is transmitted from a website, a server, or another remote source by using a coaxial cable, an optical fiber/cable, a twisted pair, a digital subscriber line (DSL) or wireless technologies such as infrared ray, radio and microwave, and the coaxial cable, optical fiber/cable, twisted pair, DSL or wireless technologies such as infrared ray, radio, and microwave are included in the definition of the medium to which they belong. For example, a disk and a disc used by the present application include a compact disc (CD), a laser disc, an optical disc, a digital versatile disc (DVD), a floppy disk, and a Blu-ray disc. The disk usually copies data by a magnetic means, and the disc copies data optically by a laser means. The foregoing combination should also be included in the protection scope of the computer-readable medium.

It should be noted that "/" in this application indicates and/or, for example, "encoding/decoding (encoding and/or decoding)" means encoding, decoding, or encoding and decoding.

In summary, what is described above is merely example embodiments of the technical solutions of the present application, but is not intended to limit the protection scope of the present application. Any modification, equivalent replacement, or improvement made without departing from the spirit and principle of the present application shall fall within the protection scope of the present application.

What is claimed is:

1. An encoding method comprising:
   encoding an input sequence by using a low density parity check (LDPC) matrix, wherein
   the LDPC matrix is obtained based on a lifting factor Z and a base matrix, and the base matrix comprises a row 0 to a row 4 and a column 0 to a column 26 in one of the following matrices: 30b-10, 30b-20, 30b-30, 30b-40, 30b-50, 30b-60, 30b-70, and 30b-80, or the base matrix comprises a row 0 to a row 4 and some of a column 0 to a column 26 in one of the following matrices: 30b-10, 30b-20, 30b-30, 30b-40, 30b-50, 30b-60, 30b-70, and 30b-80.

2. The method according to claim 1, wherein the base matrix further comprises the row 0 to a row (m−1) and the column 0 to a column (n−1) in one of the following matrices: 30b-10, 30b-20, 30b-30, 30b-40, 30b-50, 30b-60, 30b-70, and 30b-80, wherein 5≤m≤46, and 27≤n≤68.

3. The method according to claim 1, wherein the lifting factor $z=a \times 2^j$, $0 \leq j < 7$, and $a \in \{2, 3, 5, 7, 9, 11, 13, 15\}$; and
   if a=2, the base matrix comprises a row 0 to a row 4 and a column 0 to a column 26 in the matrix 30b-10, or the base matrix comprises a row 0 to a row 4 and some of a column 0 to a column 26 in the matrix 30b-10; or
   if a=3, the base matrix comprises a row 0 to a row 4 and a column 0 to a column 26 in the matrix 30b-20, or the base matrix comprises a row 0 to a row 4 and some of a column 0 to a column 26 in the matrix 30b-20; or
   if a=5, the base matrix comprises a row 0 to a row 4 and a column 0 to a column 26 in the matrix 30b-30, or the base matrix comprises a row 0 to a row 4 and some of a column 0 to a column 26 in the matrix 30b-30; or
   if a=7, the base matrix comprises a row 0 to a row 4 and a column 0 to a column 26 in the matrix 30b-40, or the base matrix comprises a row 0 to a row 4 and some of a column 0 to a column 26 in the matrix 30b-40; or
   if a=9, the base matrix comprises a row 0 to a row 4 and a column 0 to a column 26 in the matrix 30b-50, or the base matrix comprises a row 0 to a row 4 and some of a column 0 to a column 26 in the matrix 30b-50; or
   if a=11, the base matrix comprises a row 0 to a row 4 and a column 0 to a column 26 in the matrix 30b-60, or the base matrix comprises a row 0 to a row 4 and some of a column 0 to a column 26 in the matrix 30b-60; or
   if a=13, the base matrix comprises a row 0 to a row 4 and a column 0 to a column 26 in the matrix 30b-70, or the base matrix comprises a row 0 to a row 4 and some of a column 0 to a column 26 in the matrix 30b-70; or
   if a=15, the base matrix comprises a row 0 to a row 4 and a column 0 to a column 26 in the matrix 30b-80, or the base matrix comprises a row 0 to a row 4 and some of a column 0 to a column 26 in the matrix 30b-80.

4. The method according to claim 3, wherein
   if a=2, the base matrix further comprises the row 0 to a row (m−1) and the column 0 to a column (n−1) in the matrix 30b-10, wherein 5≤m≤46 and 27≤n≤68; or
   if a=3, the base matrix further comprises the row 0 to a row (m−1) and the column 0 to a column (n−1) in the matrix 30b-20 1, wherein 5≤m≤46 and 27≤n≤68; or
   if a=5, the base matrix further comprises the row 0 to a row (m−1) and the column 0 to a column (n−1) in the matrix 30b-30, wherein 5≤m≤46 and 27≤n≤68; or
   if a=7, the base matrix further comprises the row 0 to a row (m−1) and the column 0 to a column (n−1) in the matrix 30b-40, wherein 5≤m≤46 and 27≤n≤68; or
   if a=9, the base matrix further comprises the row 0 to a row (m−1) and the column 0 to a column (n−1) in the matrix 30b-50, wherein 5≤m≤46 and 27≤n≤68; or
   if a=11, the base matrix further comprises the row 0 to a row (m−1) and the column 0 to a column (n−1) in the matrix 30b-60, wherein 5≤m≤46 and 27≤n≤68; or
   if a=13, the base matrix further comprises the row 0 to a row (m−1) and the column 0 to a column (n−1) in the matrix 30b-70, wherein 5≤m≤46 and 27≤n≤68; or
   if a=15, the base matrix further comprises the row 0 to a row (m−1) and the column 0 to a column (n−1) in the matrix 30b-80, wherein 5≤m≤46 and 27≤n≤68.

5. The method according to claim 1, wherein the LDPC matrix is obtained based on the lifting factor Z and a matrix Hs that is obtained by compensating the base matrix, wherein the matrix Hs is obtained by increasing or decreasing, by an offset $Offset_s$, each shift value that is greater than or equal to 0 and that corresponds to an element in at least one column s in the base matrix, and the offset $\text{Offset}_s$ is an integer greater than or equal to 0, and $0 \leq s < 23$.

6. The method according claim 5, wherein the LDPC matrix is obtained based on the lifting factor Z and a matrix that is obtained by performing row switching, or column switching, or row switching and column switching on the base matrix or the compensation matrix Hs of the base matrix.

7. A decoding method comprising:
decoding an input sequence by using a low density parity check (LDPC) matrix, wherein
the LDPC matrix is obtained based on a lifting factor Z and a base matrix, and the base matrix comprises a row 0 to a row 4 and a column 0 to a column 26 in one of the following matrices: 30b-10, 30b-20, 30b-30, 30b-40, 30b-50, 30b-60, 30b-70, and 30b-80, or the base matrix comprises a row 0 to a row 4 and some of a column 0 to a column 26 in one of the following matrices: 30b-10, 30b-20, 30b-30, 30b-40, 30b-50, 30b-60, 30b-70, and 30b-80.

8. The method according to claim 7, wherein the base matrix further comprises the row 0 to a row (m−1) and the column 0 to a column (n−1) in one of the following matrices: 30b-10, 30b-20, 30b-30, 30b-40, 30b-50, 30b-60, 30b-70, and 30b-80, wherein 5 m≤46, and 27≤n≤68.

9. The method according to claim 7, wherein the lifting factor $z = a \times 2^j$, $0 \leq j < 7$, and $a \in \{2, 3, 5, 7, 9, 11, 13, 15\}$; and
if a=2, the base matrix comprises a row 0 to a row 4 and a column 0 to a column 26 in the matrix 30b-10, or the base matrix comprises a row 0 to a row 4 and some of a column 0 to a column 26 in the matrix 30b-10; or
if a=3, the base matrix comprises a row 0 to a row 4 and a column 0 to a column 26 in the matrix 30b-20, or the base matrix comprises a row 0 to a row 4 and some of a column 0 to a column 26 in the matrix 30b-20; or
if a=5, the base matrix comprises a row 0 to a row 4 and a column 0 to a column 26 in the matrix 30b-30, or the base matrix comprises a row 0 to a row 4 and some of a column 0 to a column 26 in the matrix 30b-30; or
if a=7, the base matrix comprises a row 0 to a row 4 and a column 0 to a column 26 in the matrix 30b-40, or the base matrix comprises a row 0 to a row 4 and some of a column 0 to a column 26 in the matrix 30b-40; or
if a=9, the base matrix comprises a row 0 to a row 4 and a column 0 to a column 26 in the matrix 30b-50, or the base matrix comprises a row 0 to a row 4 and some of a column 0 to a column 26 in the matrix 30b-50; or
if a=11, the base matrix comprises a row 0 to a row 4 and a column 0 to a column 26 in the matrix 30b-60, or the base matrix comprises a row 0 to a row 4 and some of a column 0 to a column 26 in the matrix 30b-60; or
if a=13, the base matrix comprises a row 0 to a row 4 and a column 0 to a column 26 in the matrix 30b-70, or the base matrix comprises a row 0 to a row 4 and some of a column 0 to a column 26 in the matrix 30b-70; or
if a=15, the base matrix comprises a row 0 to a row 4 and a column 0 to a column 26 in the matrix 30b-80, or the base matrix comprises a row 0 to a row 4 and some of a column 0 to a column 26 in the matrix 30b-80.

10. The method according to claim 9, wherein
if a=2, the base matrix further comprises the row 0 to a row (m−1) and the column 0 to a column (n−1) in the matrix 30b-10, wherein 5≤m≤46 and 27≤n≤68; or
if a=3, the base matrix further comprises the row 0 to a row (m−1) and the column 0 to a column (n−1) in the matrix 30b-20 1, wherein 5≤m≤46 and 27≤n≤68; or
if a=5, the base matrix further comprises the row 0 to a row (m−1) and the column 0 to a column (n−1) in the matrix 30b-30, wherein 5≤m≤46 and 27≤n≤68; or
if a=7, the base matrix further comprises the row 0 to a row (m−1) and the column 0 to a column (n−1) in the matrix 30b-40, wherein 5≤m≤46 and 27≤n≤68; or
if a=9, the base matrix further comprises the row 0 to a row (m−1) and the column 0 to a column (n−1) in the matrix 30b-50, wherein 5≤m≤46 and 27≤n≤68; or
if a=11, the base matrix further comprises the row 0 to a row (m−1) and the column 0 to a column (n−1) in the matrix 30b-60, wherein 5≤m≤46 and 27≤n≤68; or
if a=13, the base matrix further comprises the row 0 to a row (m−1) and the column 0 to a column (n−1) in the matrix 30b-70, wherein 5≤m≤46 and 27≤n≤68; or
if a=15, the base matrix further comprises the row 0 to a row (m−1) and the column 0 to a column (n−1) in the matrix 30b-80, wherein 5≤m≤46 and 27≤n≤68.

11. The method according to claim 7, wherein the LDPC matrix is obtained based on the lifting factor Z and a matrix Hs that is obtained by compensating the base matrix, wherein the matrix Hs is obtained by increasing or decreasing, by an offset $\text{Offset}_s$, each shift value that is greater than or equal to 0 and that corresponds to an element in at least one column s in the base matrix, and the offset $\text{Offset}_s$ is an integer greater than or equal to 0, and $0 \leq s < 23$.

12. The method according claim 11, wherein the LDPC matrix is obtained based on the lifting factor Z and a matrix that is obtained by performing row switching, or column switching, or row switching and column switching on the base matrix or the compensation matrix Hs of the base matrix.

13. A terminal comprising:
a memory having instructions stored therein; and a processor, wherein the instructions when executed by the processor, cause the processor to perform a method comprising:
encoding an input sequence by using a low density parity check (LDPC) matrix, wherein
the LDPC matrix is obtained based on a lifting factor Z and a base matrix, and the base matrix comprises a row 0 to a row 4 and a column 0 to a column 26 in one of the following matrices: 30b-10, 30b-20, 30b-30, 30b-40, 30b-50, 30b-60, 30b-70, and 30b-80, or the base matrix comprises a row 0 to a row 4 and some of a column 0 to a column 26 in one of the following matrices: 30b-10, 30b-20, 30b-30, 30b-40, 30b-50, 30b-60, 30b-70, and 30b-80.

14. The terminal according to claim 13, wherein the base matrix further comprises the row 0 to a row (m−1) and the column 0 to a column (n−1) in one of the following matrices: 30b-10, 30b-20, 30b-30, 30b-40, 30b-50, 30b-60, 30b-70, and 30b-80, wherein 5≤m≤46, and 27≤n≤68.

15. The terminal according to claim 13, wherein the lifting factor $z = a \times 2^j$, $0 \leq j < 7$, and $a \in \{2, 3, 5, 7, 9, 11, 13, 15\}$; and
if a=2, the base matrix comprises a row 0 to a row 4 and a column 0 to a column 26 in the matrix 30b-10, or the base matrix comprises a row 0 to a row 4 and some of a column 0 to a column 26 in the matrix 30b-10; or
if a=3, the base matrix comprises a row 0 to a row 4 and a column 0 to a column 26 in the matrix 30b-20, or the base matrix comprises a row 0 to a row 4 and some of a column 0 to a column 26 in the matrix 30b-20; or
if a=5, the base matrix comprises a row 0 to a row 4 and a column 0 to a column 26 in the matrix 30b-30, or the base matrix comprises a row 0 to a row 4 and some of a column 0 to a column 26 in the matrix 30b-30; or if a=7, the base matrix comprises a row 0 to a row 4 and a column 0 to a column 26 in the matrix 30b-40, or the base matrix comprises a row 0 to a row 4 and some of a column 0 to a column 26 in the matrix 30b-40; or if a=9, the base matrix comprises a row 0 to a row 4 and a column 0 to a column 26 in the matrix 30b-50, or the base matrix comprises a row 0 to a row 4 and some of a column 0 to a column 26 in the matrix 30b-50; or if a=11, the base matrix comprises a row 0 to a row 4 and a column 0 to a column 26 in the matrix 30b-60, or the base matrix comprises a row 0 to a row 4 and some of a column 0 to a column 26 in the matrix 30b-60; or if a=13, the base matrix comprises a row 0 to a row 4 and a column 0 to a column 26 in the matrix 30b-70, or the base matrix comprises a row 0 to a row 4 and some of a column 0 to a column 26 in the matrix 30b-70; or if a=15, the base matrix comprises a row 0 to a row 4 and a column 0 to a column 26 in the matrix 30b-80, or the base matrix comprises a row 0 to a row 4 and some of a column 0 to a column 26 in the matrix 30b-80.

16. The terminal according to claim 15, wherein if a=2, the base matrix further comprises the row 0 to a row (m−1) and the column 0 to a column (n−1) in the matrix 30b-10, wherein 5≤m≤46 and 27≤n≤68; or if a=3, the base matrix further comprises the row 0 to a row (m−1) and the column 0 to a column (n−1) in the matrix 30b-20 1, wherein 5≤m≤46 and 27≤n≤68; or if a=5, the base matrix further comprises the row 0 to a row (m−1) and the column 0 to a column (n−1) in the matrix 30b-30, wherein 5≤m≤46 and 27≤n≤68; or if a=7, the base matrix further comprises the row 0 to a row (m−1) and the column 0 to a column (n−1) in the matrix 30b-40, wherein 5≤m≤46 and 27≤n≤68; or if a=9, the base matrix further comprises the row 0 to a row (m−1) and the column 0 to a column (n−1) in the matrix 30b-50, wherein 5≤m≤46 and 27≤n≤68; or if a=11, the base matrix further comprises the row 0 to a row (m−1) and the column 0 to a column (n−1) in the matrix 30b-60, wherein 5≤m≤46 and 27≤n≤68; or if a=13, the base matrix further comprises the row 0 to a row (m−1) and the column 0 to a column (n−1) in the matrix 30b-70, wherein 5≤m≤46 and 27≤n≤68; or if a=15, the base matrix further comprises the row 0 to a row (m−1) and the column 0 to a column (n−1) in the matrix 30b-80, wherein 5≤m≤46 and 27≤n≤68.

17. The terminal according to claim 13, wherein the LDPC matrix is obtained based on the lifting factor Z and a matrix Hs that is obtained by compensating the base matrix, wherein the matrix Hs is obtained by increasing or decreasing, by an offset $Offset_s$, each shift value that is greater than or equal to 0 and that corresponds to an element in at least one column s in the base matrix, and the offset $Offset_s$ is an integer greater than or equal to 0, and 0≤s<23.

18. The terminal according to claim 17, wherein the LDPC matrix is obtained based on the lifting factor Z and a matrix that is obtained by performing row switching, or column switching, or row switching and column switching on the base matrix or the compensation matrix Hs of the base matrix.

* * * * *

UNITED STATES PATENT AND TRADEMARK OFFICE
CERTIFICATE OF CORRECTION

PATENT NO. : 11,088,706 B2
APPLICATION NO. : 16/719529
DATED : August 10, 2021
INVENTOR(S) : Jie Jin et al.

Page 1 of 1

It is certified that error appears in the above-identified patent and that said Letters Patent is hereby corrected as shown below:

In the Claims

Claim 8, Column 41, Line 26, delete "5 m≤46" and insert -- $5 \leq m \leq 46$ --.

Signed and Sealed this
Ninth Day of August, 2022

Katherine Kelly Vidal
*Director of the United States Patent and Trademark Office*